US007768251B2

(12) United States Patent
Maher

(10) Patent No.: US 7,768,251 B2
(45) Date of Patent: Aug. 3, 2010

(54) SUPERCONDUCTING COIL TESTING

(75) Inventor: Eamonn Maher, Oxfordshire (GB)

(73) Assignee: 3-CS, Ltd., Worcestershire (GB)

( * ) Notice: Subject to any disclaimer, the term of this patent is extended or adjusted under 35 U.S.C. 154(b) by 760 days.

(21) Appl. No.: 10/548,086

(22) PCT Filed: Mar. 5, 2004

(86) PCT No.: PCT/GB2004/000923

§ 371 (c)(1),
(2), (4) Date: May 4, 2007

(87) PCT Pub. No.: WO2004/079758

PCT Pub. Date: Sep. 16, 2004

(65) Prior Publication Data

US 2007/0298971 A1 Dec. 27, 2007

(30) Foreign Application Priority Data

Mar. 6, 2003 (GB) ................................ 0305146.3

(51) Int. Cl.
*G01N 27/00* (2006.01)
*G01R 31/11* (2006.01)
*G01R 31/02* (2006.01)

(52) U.S. Cl. ....................... 324/71.6; 324/534; 324/537

(58) Field of Classification Search ................ 324/71.6, 324/534, 512, 537
See application file for complete search history.

(56) References Cited

U.S. PATENT DOCUMENTS 5,218,296 A * 6/1993 Shinde et al. ............... 324/239
5,854,492 A * 12/1998 Chinone et al. ............... 257/31
5,912,211 A 6/1999 Yamazaki
2002/0163333 A1 11/2002 Schlicker et al.

FOREIGN PATENT DOCUMENTS

WO WO 03/019589 A 3/2003

* cited by examiner

*Primary Examiner*—Amy He
(74) *Attorney, Agent, or Firm*—Banner & Witcoff, Ltd.

(57) ABSTRACT

A method of testing a superconducting coil path formed in a layer of superconducting material. The material is provided on a former (6) having a substantially curved surface. The method comprises the step of scanning the layer to detect defects in the layer.

49 Claims, 11 Drawing Sheets

SUPERCONDUCTING COIL TESTING

CROSS REFERENCE TO RELATED APPLICATIONS

This application is a National Stage application of co-pending PCT application PCT/GB2004/000923 filed 5 Mar. 2004, which was published in the English language under PCT Article 21(2) on 16 Sep. 2004, and claims the benefit of GB 0305146.3 filed 6 Mar. 2003.

TECHNICAL FIELD

This invention relates to a testing step used in superconducting coil fabrication, and to superconducting coils so fabricated.

BACKGROUND

Current methods used to fabricate superconducting coils are described in European patent application 02 755 238.9, first published as a PCT patent, application number PCT/GB02/03898, on 6 Mar. 2003 and entitled "Superconducting Coil Fabrication". That application disclosed a method of fabricating a superconducting coil. That method comprises a first step of fabricating individual coil tracks by depositing, shaping and texturing superconductive material using film deposition and patterning techniques, in situ, in individual deposited layers on a former which has a substantially curved surface. The method comprises further steps of testing, in situ, each coil track in terms of texture or superconducting performance and fabricating the coil tracks whereby each deposited layer is patterned by a masking, or marking, operation before, or after, layer deposition. The testing step, therein described, is used at specified steps of the fabrication process. However, it is used only to test whether the coil superconducts, or has appropriate texture for having superconductive properties. Each coil, therefore, passes or fails that testing step. Even if the probability of fabricating a coil track which fails this test is low, the chances of having one or more failed coil tracks in the superconducting coil increases with an increase in the number of layers to the coil, so reducing effectiveness of the fabricated coil and increasing the wastage produced in the fabrication process.

A superconducting coil track may fail the testing step if the coil track comprises a serious defect. That defect can be of a number of types: a repairable defect; an irreparable defect; and a defect, of either repairable and irreparable form, that propagates through successive layers by virtue of a copying process. Therefore, a coil fabricated by the current method is unusable if one layer has a propagating defect, as all further layers would have that same defect and would fail the testing step.

The field created by the fabricated superconducting coil is also defined by the configuration of the coil, and therefore the coil tracks that comprise the coil, and the current passing through the coil. For a current to pass through the coil, all parts of each coil track must allow passage of that current; that is to say the components of the track which comprise each coil track are in series. The final current which can be passed through the coil is limited by the weakest link in the coil. The weak links in the coil are caused by, amongst other causes (such as poor connections between coil tracks), defects in the layers.

Further, the geometry of the field generated by a coil track having a specific geometry and a defect will differ from the field generated by a coil track having exactly the same properties, but without the defect. The field differs not only because a different current passes through the coil track, but because the physical geometry of the comparable parts of the two coil tracks differ in the locality of the defect, and the defect may comprise a chemical impurity or the material in the locality of the defect may have a crystalline or lattice structure different from the rest of the material in the coil track. The defect may cause the coil track to exhibit different physical characteristics from the coil track without defects, in superconducting conditions. Therefore, as successive coil tracks are created on the former, with each coil track having its own unique defects, the shape of the field created by the coil varies from that of a coil created from coil tracks that do not have any defects.

If the path of a coil track is varied to avoid irreparable defects in its layer, the shape of the field produced by the coil in superconducting conditions is also varied. However, as a given coil track can be defined onto its layer so as to avoid defects, the path of that coil track can be adapted to rectify the shape of the field produced under superconducting conditions by that coil track, together with the fields from other coil tracks underneath that coil track.

Although the known method refers to a testing step for each coil track before fabrication of the coil is continued, the testing is used only to determine whether the coil track works, and not to locate defects in the coil track for repair or avoiding. The defects in the layer are not identified or repaired. Further, the path of the coil track defined onto, or into, the layer is not varied to avoid the weak links, irreparable defects, and to rectify the produced superconducting field, but to provide a specific geometry of coil configuration.

The known fabrication process can be improved to increase the proportion of working coil tracks fabricated by means of the fabrication process: by identifying whether each defect present in a layer is repairable; repairing the repairable defects; choosing a path of coil track that avoids the irreparable defects; calculating the effect on the geometry of the produced superconducting field by that coil track and to rectify the shape of the superconducting field corresponding to underlying coil tracks; amending the chosen path of coil track to account for these effects to the produced superconducting field; and defining the path into or onto the layer in order to create the coil track. Further, before the fabrication procedure continues with the deposition of a further layer, so long as the layer is a superconducting layer, the coil track can be tested to ensure it superconducts.

The aim of the present invention is to provide such an improved method for fabricating superconducting coils by means of a testing step.

DEFINITIONS OF TERMS

In this specification, the following terms are intended to have specific meanings as defined herein:

The configuration of a coil track is the three-dimensional geometry of the coil track, which is specifically the path of the coil and in the interconnection scheme of the coil track, which might be on more than one layer.

Copying is the reproduction of the texture of the underlying layer, namely, the reproduction of a template. A copying process is a process that applies such copying.

Defining is the determining of a boundary or extent of a feature in a layer, or the delineation of the form of the features of a layer. Defining therefore includes: writing, copying, printing and printing.

An external field is a field emanating from another source other than the coil currently being fabricated. Typically, the source of these external fields are coils of an electrical device or machine of which the coil being fabricated is intended to form part. These other coils are or will be adjacent to, and in the vicinity of, the coil being fabricated.

A layer is a single deposition of a film, preferably a thin film, on the surface of the former (for the deposition of the initial layer), or the surface of the topmost layer on the former (for the deposition of subsequent layers).

A path or coil path is a route around which calculations are made in order to define the best optimised track for the superconducting coil. Thus it is a virtual track.

Patterning is the removing or adding of material in a specific geometry, including the defining of a path in a layer.

Printing is writing in parallel.

Texture is the physical appearance in terms of roughness and shape of surface features; in microscopical examination it relates to microstructural features such as grain shape, distribution of phases, grain boundary characteristics and crystallographic orientation. It is, more specifically in this application, crystallographic texture or preferred crystallographic orientation. In relation to superconducting materials, the texture of a sample of superconducting material is indicative of the superconducting properties of that sample. Generally, the texture of a material, such as the texture of a thin film superconductor, is detected by way of x-ray or neutron diffraction, electron back scattering diffraction, and other techniques that use an electron beam, such as an electron microscope. A further technique is RHEED (Reflection High Energy Electron Diffraction).

Texturing is copying into a layer the texture of an underlying layer or, in the case of an initial layer, it is the growing of a textured film.

A track is a coil path defined into a superconducting layer.

A turn is a single loop around a former having a substantially curved surface.

A weak area, also known as a bad area, is an area which falls below a threshold of a required property.

A winding is a single coil track and, in the context of this specification, it is not formed by a physical winding process.

Writing is geometrically, locally defining a path or a track, by the laying down or removal of material. Writing can include: etching, scribing and lithographic methods.

SUMMARY

In accordance with a first aspect of the present invention there is provided a method of testing a path formed in a layer of thin film material for use in a superconducting coil, the layer provided on a former having a substantially curved surface, the method comprising the step of scanning the layer to detect defects in the layer.

Advantageously, each defect in the layer can be detected by the step of scanning the layer in order to detect defects present in the layer so that the path can be optimised before it is defined into or onto the layer and before proceeding to the deposition of the next layer in the multi-layer coil.

The former can define a substantially right circular cylindrical surface and the coil path defines a substantially spiral track about the former. Advantageously, the rotational axis of symmetry of the former facilities the manufacture of the successive windings in the multi-layer coil and, consequently, the ease of manufacture of a such a coil.

Preferably, the scanning step comprises at least one probing step, for probing a physical property of the material comprising the layer, the or each probing step being carried out without the coil path being defined in the layer. Advantageously, the location and the physical properties of each defect can be determined.

The scanning step may comprises a plurality of probing steps, a different physical property of the material being probed during each probing step.

The or each probing step can provide a data set of the physical properties of the layer, each data set being processable to form a respective map having features indicating variations in the physical properties over the layer. Advantageously, each data set can be compared to a similar data set. The similar data set can be a data set for a layer previously deposited on the former or a data set obtained from the earlier manufacture of a similar coil. As the same apparatus is used to manufacture many coils, errors in manufacturing of a coil can be overcome by the processor accounting for these errors by comparing these data sets.

Preferably, each map is combined with one or more of the other maps to provide a composite map.

Each map may be weighted relative to each other map when combined to provide the composite map.

Preferably, the features of each map (including the composite map) are analysed to identify and locate defects in the layer.

More preferably, the method further comprises the steps of: a) identifying whether each defect is a repairable defect; and b) repairing each repairable defect.

The method can further comprise the steps of: a) identifying whether each defect is irreparable; and b) calculating the coil path that avoids the irreparable defect(s); and c) writing or patterning the path in the layer to define the path of a coil track.

Preferably, the step of calculating the coil path comprises the step of adapting the path of the coil track such that the coil track produces a magnetic field that is predetermined.

The step of adapting the coil path to rectify the shape of the field produced by the coil track can also account for the fields produced by each other existing coil track that comprises the coil. Advantageously, the coil is a multi-layer coil.

The step of adapting the coil path to rectify the shape of the field produced by the coil track may also account for the fields external to the coil. Advantageously, the shape of the field created by the coil comprising the coil path is adapted to account for fields which may emanate from other coils in the device, or electromagnetic machine, in which the coil is intended to be used. In this context, rectifying the shape of the field means the coil path for the track is amended to avoid certain parts of the layer and to follow a different route in the layer thereby altering the shape of the field.

The method further can comprise the step of abandoning each part of the layer, where that part comprises too many defects to be repairable or avoidable, or where it would be easier to abandon than repair or avoid. Advantageously, those parts of the layer which are not abandoned can be connected together by way of an interconnection, so that the path can be defined in those parts of the layer, thereby defining a continuous track.

The layer can be a superconducting layer and the step of scanning can comprise a step of testing whether the coil path formed in the layer, defining a coil track, superconducts. Advantageously, the coil track can be checked for its superconducting properties, before further layers are deposited onto the coil.

The coil track can be tested, by means of a binary search method, to locate a part of the coil track that does not have predetermined superconducting properties.

Preferably, the binary search method uses contact brushes which are moved in an iterative procedure to locate the or each defective area. Advantageously this is a type of simple electrical test.

More preferably, the binary search method uses a probe, to perturb the superconductive properties locally. Advantageously, the probe is a laser beam.

A coil track can be tested, by means of a laser spot method, to locate a part of the coil track that does not have predetermined superconducting properties. Advantageously, the probe is a laser beam.

Alternatively, the coil track can be tested, by means of a dynamic testing technique, to locate a part of the coil track that is non-superconductive, the dynamic testing technique being dependent on at least one dynamic variable.

Preferably, at least one of the dynamic variables is the speed of rotation of the former divided by the probe repetition frequency. Advantageously, this probe can be a laser beam.

The step of testing whether the coil track superconducts can produce a result which is portrayable as a map of the coil track, the map indicating each part of the of the coil track that has poor superconducting properties and the location of the or each part on the coil track.

Preferably, a part of the coil track that has poor superconducting properties is abandoned. Alternatively, a part of the track that has poor superconducting properties is repaired. Advantageously, where the part of the track is repaired, the path of the track is also altered to avoid defects in the track.

Preferably, those parts of the coil track that are not abandoned are connected by way of at least one interconnection. Advantageously, by way of the interconnection, the coil track in the layer is continuous. Therefore, even though part of the layer has been abandoned, the parts of the track that have been repaired or did not contain defects are connected together to provide a track.

Alternatively, the layer is a buffer layer or a metallisation layer. Preferably, the coil track is formed in a subsequent layer In accordance with a second aspect of the present invention there is provided apparatus for testing a path formed in a thin film material for use in a superconducting coil, the apparatus being arranged to carry out the method provided as in the first aspect of the statements of invention.

In accordance with a third aspect of the present invention there is provided a method of fabricating a path formed in a thin film layer of material provided on a former having a substantially curved surface, the method comprising the following steps: a) depositing, shaping and texturing the material comprising the layer to form the coil path, in situ, on or in the surface of the former; and b) testing the coil track as provided by the method of the first aspect of the statements of invention.

In another, fourth, aspect of the invention, apparatus is provided for testing a path, the path being formed in a layer of thin film material for use in a superconducting coil, the layer provided on a former having a substantially curved surface, the path thereby defining a coil track, the apparatus comprising: a) scanner for scanning the layer; b) a memory for storing information; and c) a processor connected to the memory and the scanner, the processor being arranged to receive the signal received from the scanner, to process the signal extracting information from the signal, and to direct the information to the memory.

Advantageously, the apparatus is provided to scan the layer to detect physical defects present in the path, also determining the location and nature of each defect, such that each defect can be repaired or avoided to provide a working superconducting coil track formed in the layer.

Preferably, the scanner comprises at least one probe for probing a physical characteristic of the material, the or each probe being controllable by the processor for sending a signal to the processor, the processor identifying and locating each defect in the layer to provide a map of the defect(s) present in the layer, and the processor storing the map in the memory.

The apparatus can further comprise a repairer, the repairer being controllable by the processor, the processor identifying those defects that are repairable, and the repairer being arranged to repair the reparable defects.

The apparatus may further comprise a coil writer, the coil writer being controllable by the processor, the processor identifying those defects that are irreparable, the processor calculating a coil path that avoids the irreparable defects, and the coil writer being arranged to write, pattern or define a coil path in the layer, defining a coil track that superconducts.

The layer can be a thin film of superconducting material and the scanner can comprise a coil tester, the coil tester being controllable by the processor, and the coil tester being arranged to locate weakly superconducting areas of the coil track by using a probe spot test or an electrical test or a combination of both. Advantageously, the probe test can be used in combination with the electrical test to detect, locally, weak areas. These tests include: the binary search tests, dynamic techniques and the laser spot test.

Alternatively, the layer is a buffer layer or a metallisation layer. Preferably, the coil track is formed in a subsequent layer.

In a further, fifth aspect of the invention, apparatus is provided for fabricating a path formed in a thin film layer of material for use in a superconducting coil, the layer provided on a former having a substantially curved surface, the apparatus comprising: a) a deposition device being arranged to deposit, shape and texture the layer, in situ, on the surface of the former; and b) apparatus being arranged for testing the layer, as provided by the fourth aspect of the statements of invention.

In a sixth aspect of the invention a device is fabricated by way of a method, the method as provided as in the first aspect of the statements of invention. Advantageously, the device can be magnet or an electrical machine such as a motor, a generator or a transformer.

BRIEF DESCRIPTION OF THE DRAWINGS

The invention will now be described in greater detail, by way of example, with reference to FIGS. 1 to 9 of the drawings, in which:—

DETAILED DESCRIPTION OF ILLUSTRATIVE EMBODIMENTS

Figure 1:
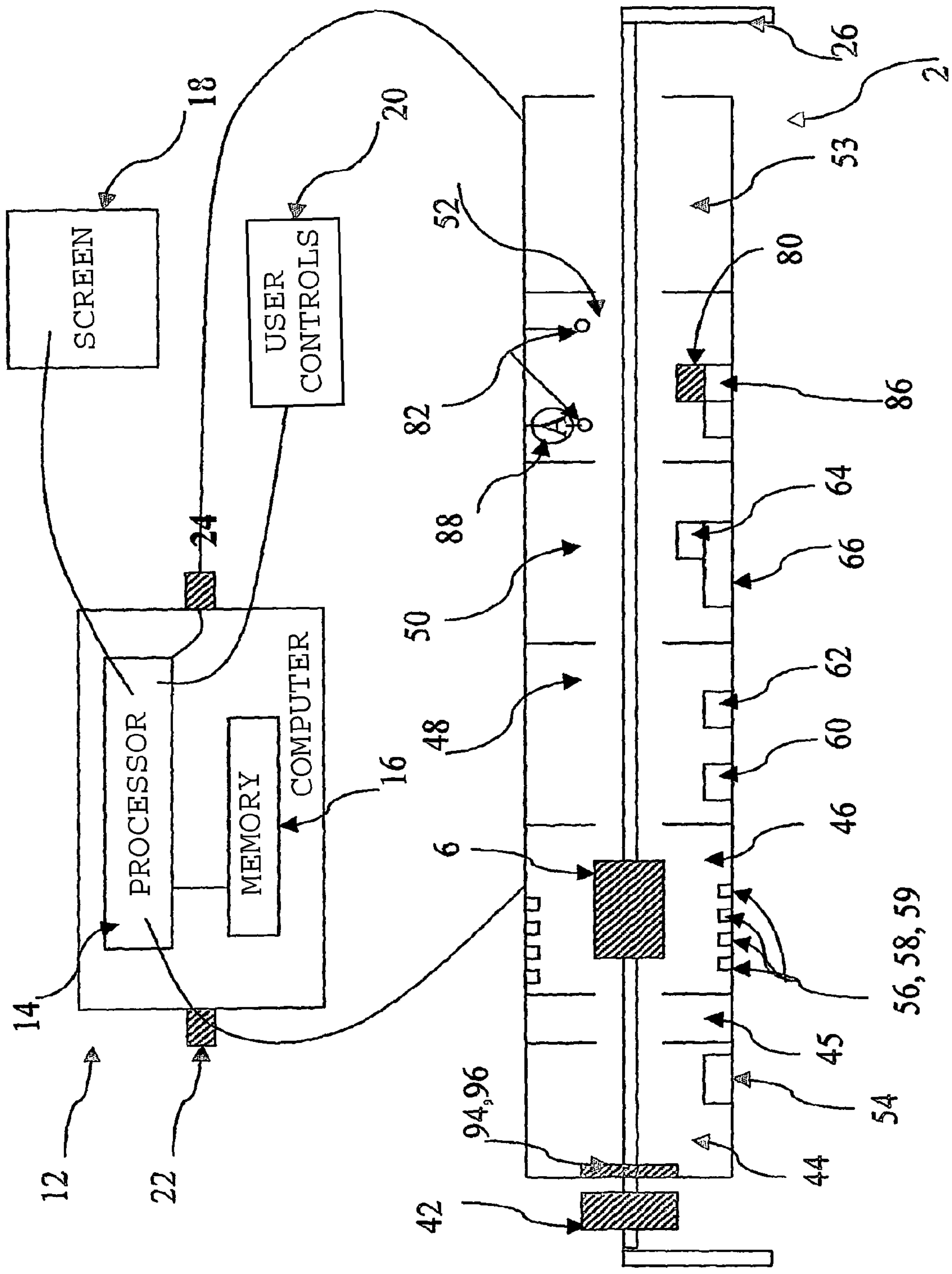
FIG. 1 is a schematic representation of apparatus for fabricating a coil comprising at least one coil track, and for testing the path of each coil track during fabrication of the coil.

Referring to the drawings, FIG. 1 illustrates a chamber 2 arranged for deposition, forming and testing one superconducting coil path. Along the length of the chamber 2 is a threaded shaft 4 upon which is located a cylindrical former 6. The chamber 2 comprises a plurality of linearly-contiguous treatment chambers. Each treatment chamber is configured to apply a different treatment. The chamber 2 has a first side 8 and a second side 10. Each side is located in a treatment chamber contiguous with only one adjacent chamber. Each side is located on the surface of that chamber furthest from the surface of the chamber contiguous with the adjacent chamber. Attached to the chamber 2 is a computer 12. The computer comprises a processor 14, a memory 16, a screen 18 and a set of user controls 20 (such as a keyboard and a mouse), as well as an input 22 and an output 24.

Figure 2:
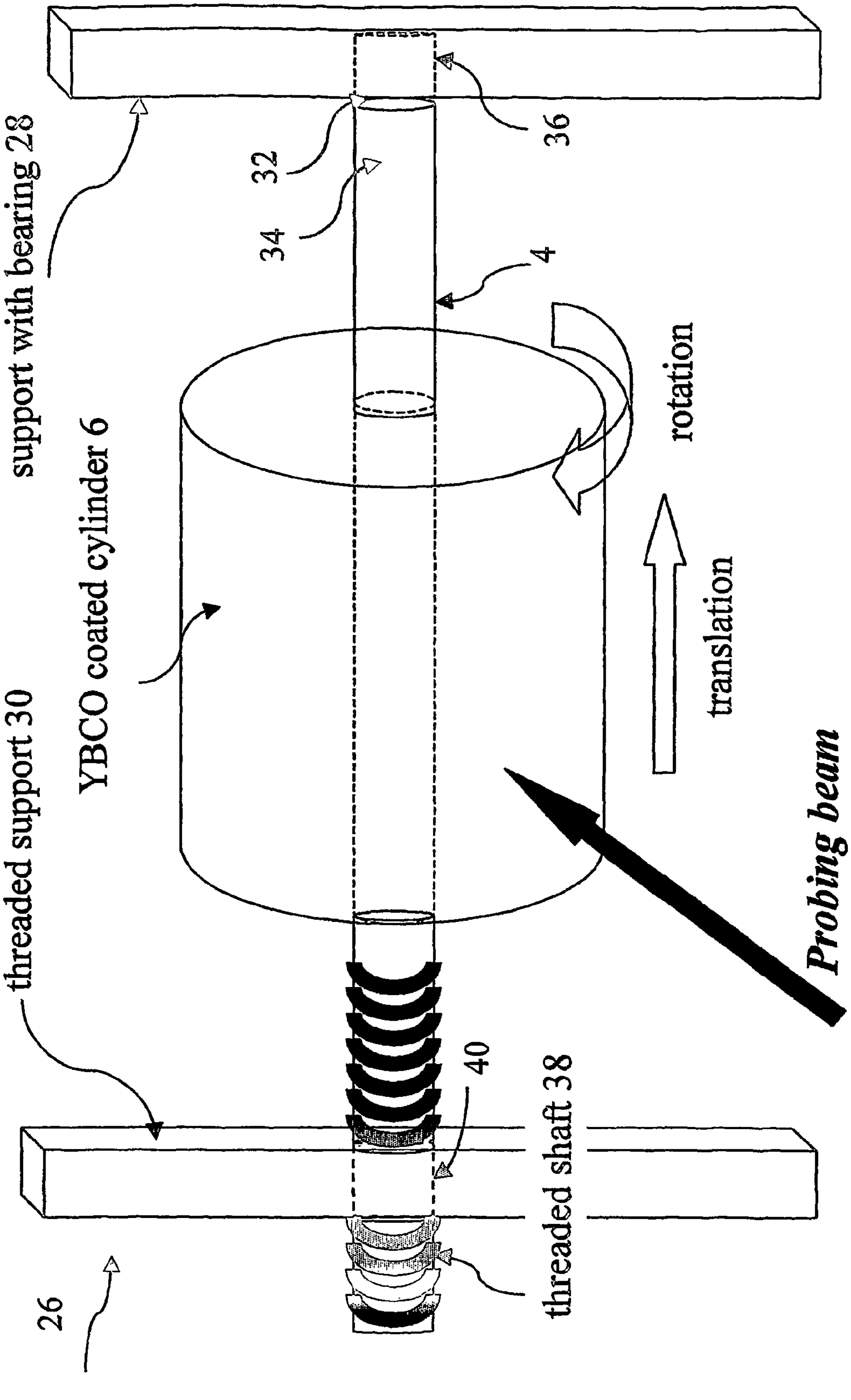
FIG. 2 is a schematic representation of a frame that is used to support the coil during fabrication of the coil.

The threaded shaft 4 comprises part of a frame 26, as shown in FIG. 2. The frame 26 further comprises a support 28 with bearings (not shown), and a threaded support 30. The support 28 has a first circular aperture 32 which accepts a first end 34 of the threaded shaft 4. In the interior surface of the first aperture 32 is located a set of bearings 36. A part of the surface of each bearing comprising the set 36 is contiguous with the surface of the shaft 4 within the first aperture 32. The part of the surface of the shaft contiguous with each bearing is smooth. Thus, the shaft 4 can freely rotate about its axis of rotation when the shaft is inserted into the first aperture 32. A second end 38 of the shaft 4 is threaded. The threaded support 30 has a second circular aperture 40, the surface of which is threaded to accept the second end 38 of the shaft 4. The cylindrical former 6 is situated on a part of the shaft 4 between the two supports 28 and 30. An electric motor 4 is connected to the threaded shaft 4, nearest the second end 38 and on the side of the threaded support furthest from the former 6. The electric motor 42 is controlled by the processor.

When the frame 26 is located in the chamber 2, the threaded support 30 is fixed at the first side 8 of the chamber and the support 28 is located at the second side 10. When the motor 42 is operated to turn the shaft 4, the shaft rotates about its axis of rotation. The threaded support 30 is fixed relative to the chamber 2. As the shaft 4 turns, the interaction between the thread on the surface of the second aperture 40 and on the surface of the shaft 4 draws the shaft 4 into, or out of, the chamber 2, depending upon the direction of rotation of the shaft 4. As the shaft 4 is displaced into, or out of, the chamber 2, the former 6 and the support 28 are simultaneously displaced the same distance relative to the chamber 2. In this way, the former 6 can be moved into, or out of, the chamber 2 as well as any particular treatment chamber, by controlling the motor 42 by means of the processor 14. Therefore, the former 6 can be shuttled between the treatment chambers. The rotation and translation of the former 6 occurs simultaneously.

The memory 16 contains a software programme comprising various algorithms, the processor 14 being arranged to extract the software from the memory 16. When operating the programme, the processor 14 is arranged to: emit signals to the screen 18; accept instructions from the set of controls 20; and transmit, by means of the output 24, signals to control various components comprised within the chamber 2. The processor 14 is also arranged to receive signals from probes (to be described below) contained within the chamber 2 by means of the input 22. The processor 14 processes those signals to extract the information carried by the signal for storage as electronic files in the memory.

Figure 3:
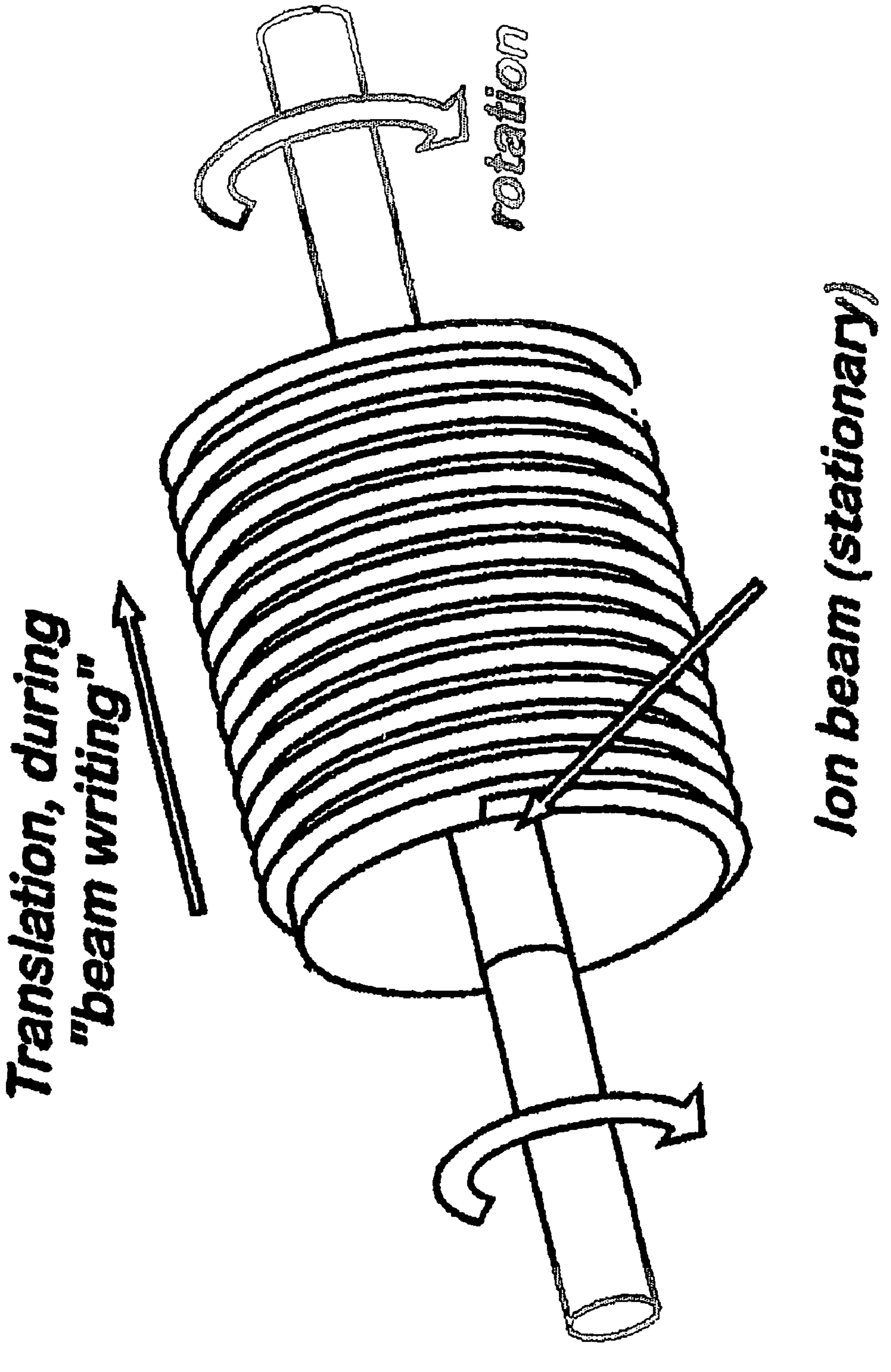
FIG. 3 is a schematic representation of a form of coil constructed using, and suitable for use with, the apparatus as shown in FIGS. 1 and 2.
Figure 4:
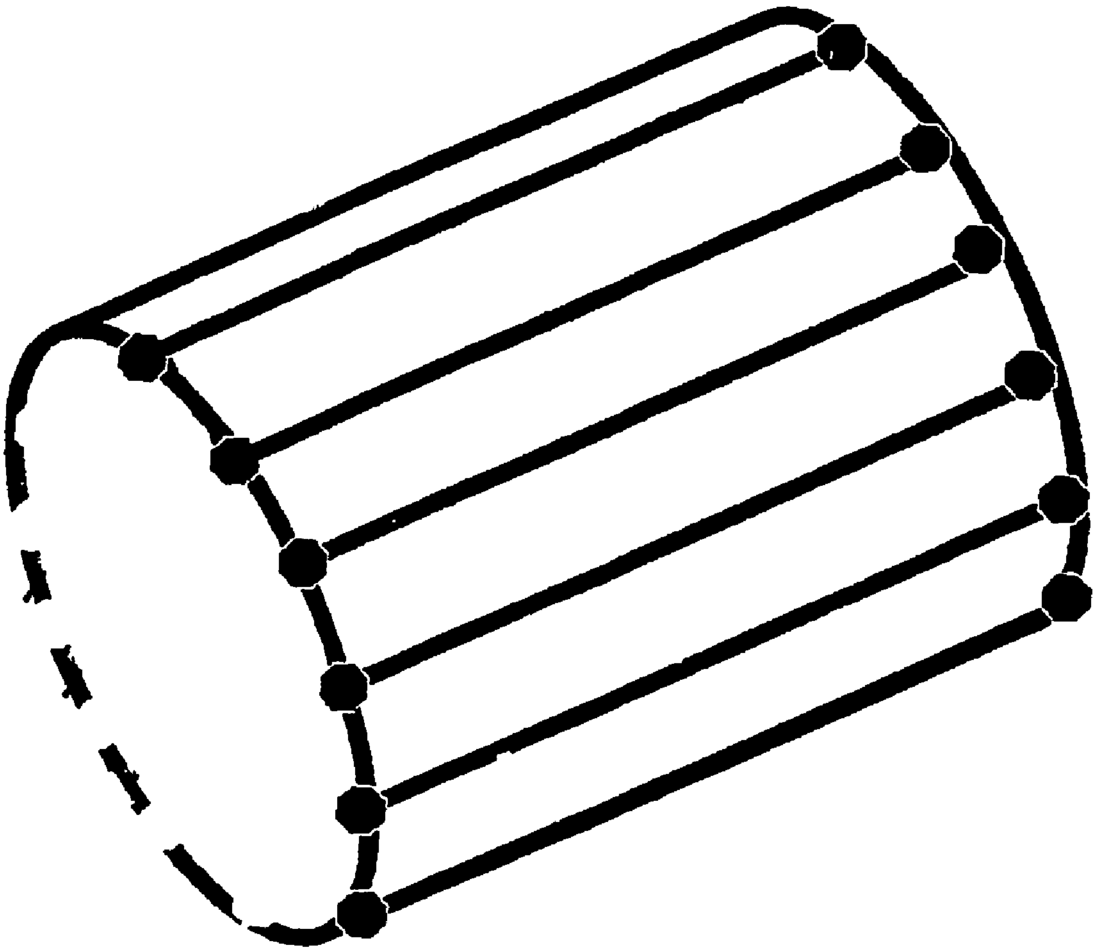
FIG. 4 is a schematic representation of a cylindrical former for use with the coil showing in FIG. 3.

FIG. 3 illustrates an early stage of construction of a superconducting coil on the former 6. The former 6, as shown in FIG. 4, is a substantially right circular cylinder. The former is preferably ceramic, thereby minimising thermal expansion problems and reducing a.c. eddy current losses which occur in metals. The coil comprises a series of alternate buffer layers, which are not superconducting, and YBCO layers, which are superconducting. Provision is also made for applying a metallic layer (a metallisation layer) to each superconducting film, and again such metallisation layers must transfer the texture of the underlying layer. Where metallisation layers are used, the multi-layer coil can comprise a repetitive series of buffer layer, superconducting layer and metallisation layer. The metallisation layer can be added both before, after, or both before and after the superconducting layer.

The initial layer can be a buffer layer. This initial buffer layer is textured, such that on deposition of the first superconducting layer, the texture of the initial buffer layer is copied onto the newly deposited layer. The texturing propagates through successive buffer, superconducting and (where they are used) metallisation layers. The superconducting properties of each superconducting layer is greatly enhanced where that layer is textured.

Transmission and propagation of texture readily occurs through epitaxial growth during deposition of a layer. Epitaxial growth of a film occurs where the growth of the crystalline film is such that the lattice structure matches well with the lattice structure of the underlying substrate or film. The thin films used here are polycrystalline because the underlying substrate or film is polycrystalline.

Other films are described as thick films. Typical applications include use with printed circuit boards. In these thick films, there is generally no epitaxial growth.

Figure 3A:
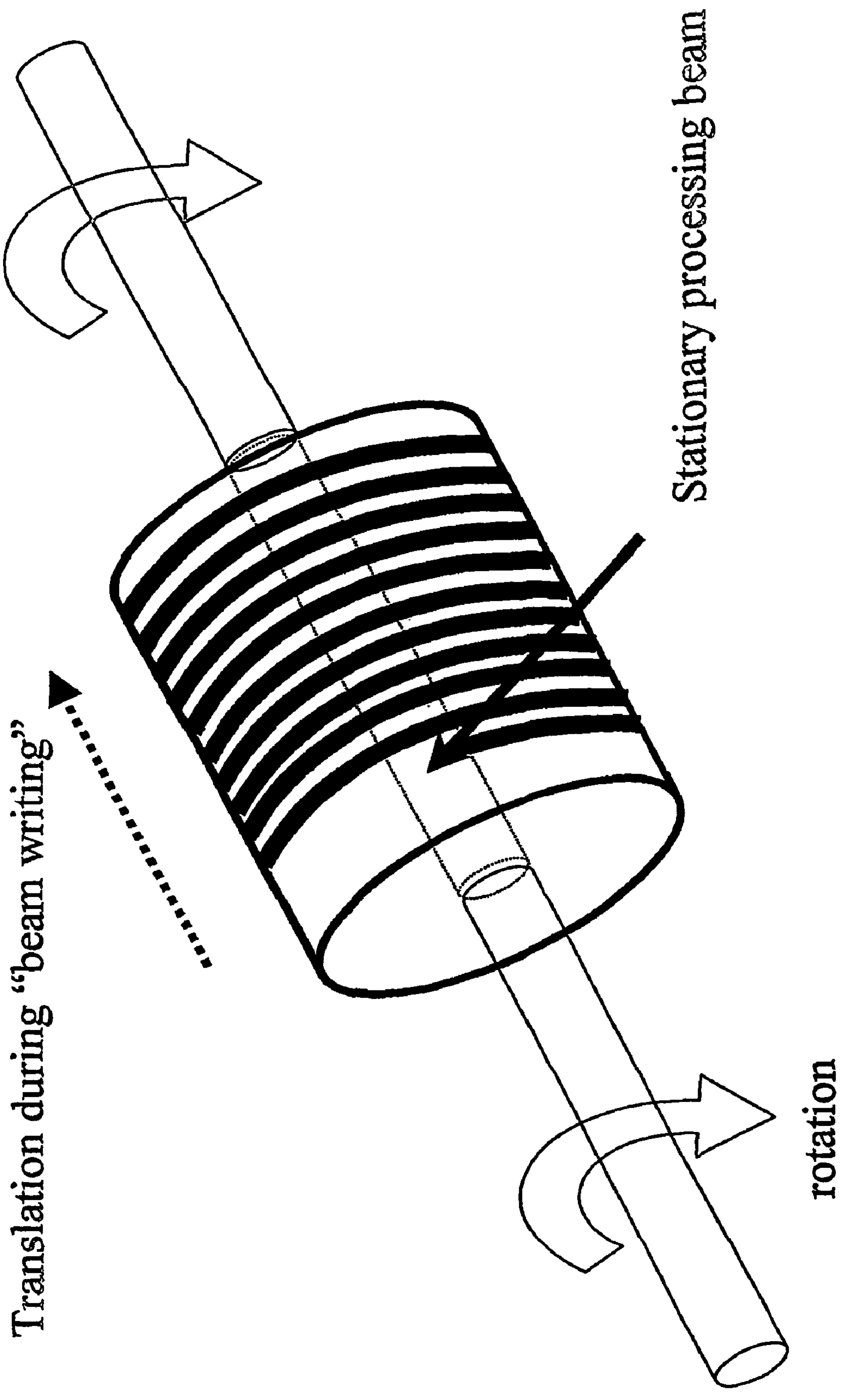
FIG. 3A is an alternative schematic representation of a form of coil shown in FIG. 3.

In FIG. 3, there are raised regions that are perceptible. These raised regions are entirely schematic and shown exaggerated in relief for the purposes of better illustrating a coil path being defined into or onto a layer as a track. FIG. 3A shows the same coil in which the same regions are shown flat, as they actually appear on the coil.

The treatment chambers present in the chamber 2 are: a deposition chamber 44, an oxygenation chamber 45, a probing chamber 46, a repairing chamber 48, a coil writing chamber 50 and a superconducting test chamber 52.

In each chamber, the devices located therein are stationary relative to that chamber, except the former 6 and the shaft 4. The former 6 translates through the chamber and rotates about its axis simultaneously. One suitable method is a screw feed which is a simple way of getting linear translation from rotating the former in a precise manner. This method is compatible with a coaxial coil which is being tested.

Figure 4A:
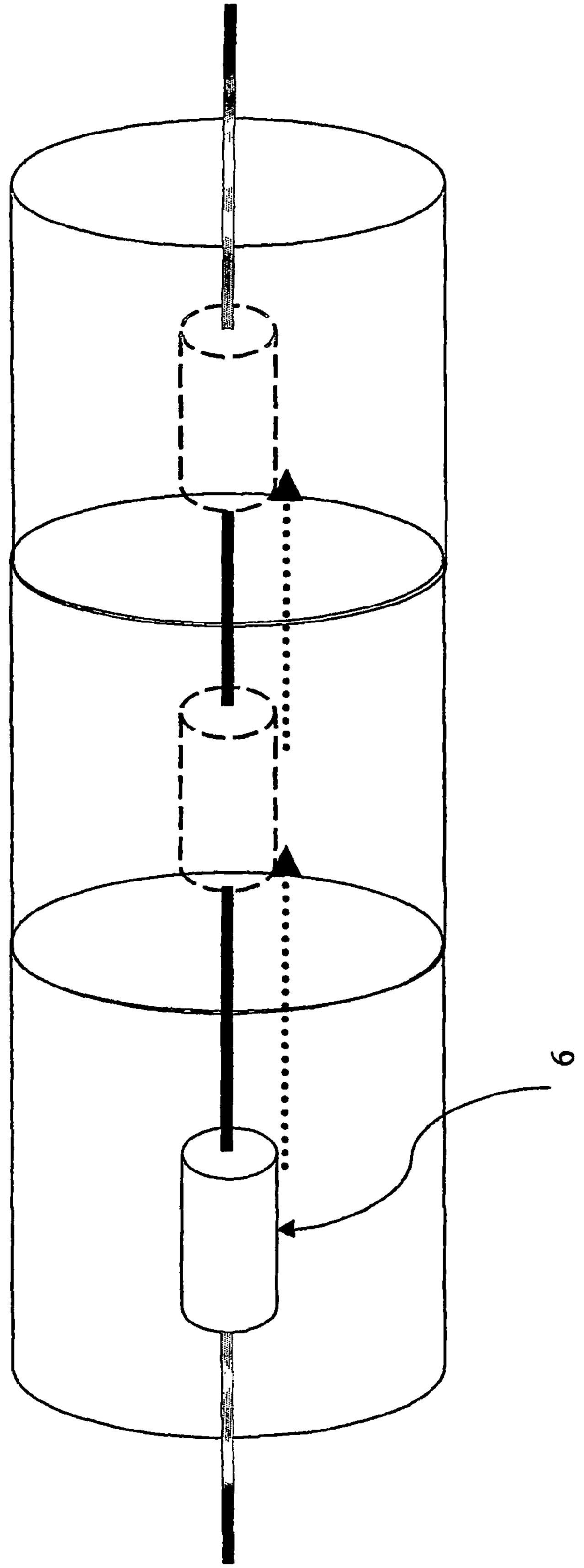
FIG. 4A is a schematic diagram of a deposition chamber.

The deposition chamber 44, as shown in FIG. 4A, comprises suitable deposition apparatus 54 to deposit a layer architecture comprising, for example, a superconducting material or a metallisation layer over the previous buffer layer, a superconducting layer or a buffer layer over a previous metallisation layer and a buffer layer or a metallisation layer over the previous coil track. The deposition apparatus 54 is controlled by the processor 14. The deposition process is described in further detail in the European patent application 02 755 238.9.

In the oxygenation chamber 45, the oxygen content of in the superconducting layer is altered to improve the superconducting properties of the layer. The full oxygenation process is described in European patent application 02 755 238.9. The layer undergoes heat treatment in an atmosphere with the oxygen content adjusted to achieve the intended oxygenation of the layer. The time-temperature relationship of the oxygenation process is monitored to ensure, for example, that the temperature ramp rate, maximum temperature reached and the duration of the treatment are optimum for the intended final oxygenation content. Oxygenation may be accomplished in situ or ex situ, so that the different layers are fabricated, and thus oxygenated in succession; or after completion of a number of layers (i.e. in sections of n layers), or of the full coil, and simultaneously oxygenating the superconducting layers of that section, or all the superconducting layers, respectively. For the latter case, it is much more likely that silver metallisation would be used as it allows the oxygen to permeate into the layers.

The probing chamber 46 comprises various probes 56 to probe each point of the surface of the layer. Each probe 56 is controlled by the processor 14. Some of those probes are controlled by the processor 14 to emit a probing beam. Each probe 56 is fixed relative to the chamber 46. The former 6 on which the layer is located is rotated and translated on its axis relative to the chamber 46 and to each probe 56, providing relative movement between the layer and the stationary probe. Thus, each point on the surface of the layer is probed by the probes 56. Each probe 56 scans the layer, interrogating the layer for a different physical property. This probing method evaluates the properties of a spatial area of the layer.

The resolution of the map of the layer, showing the features representing the variation of physical properties detected in the layer, is dependent, for each different property, upon the resolution of the corresponding probe, i.e. probing beam. Ideally, the detail of the map should be sufficient to define the path. Crucially, for the map to be of much assistance for calculating an optimised path, the resolution of the map must be sufficient to represent features in the track. Therefore, as the resolution of the map is dependent on the resolution of the probing beam, the width of the probing beam must be significantly narrower than the width of the track.

The pitch of movement of the former 6 relative to the scanning probe is defined by the amount of linear translation for each complete turn of a screw, which, if embedded in the former or driving a positioner positioning the article, corresponds to the pitch of the thread of the screw. So if the diameter of the probing beam is the same as the pitch of the screw for the translation mechanism, then a complete map of non-overlapping portions of the layer will be obtained. If there is some overlap of the path of the probe then software correction can be applied. If the path scanned by the probe is less than the pitch then the cylinder surface is only partially sampled, and this will be faster but not as thorough, providing an incomplete map of the physical property scanned by the that probe of the layer.

In a dynamic mode of probing, the response time of the physical parameters can be evaluated. The dynamic mode allows for the application of perturbation techniques for some probes, using either "small signal" or "steady state" conditions for each point on the layer interrogated by the probe. Small signal conditions are usually in a linear regime, such as in an audio amplifier; whereas large signal conditions are non-linear, such as in a switch. At slow rotation and translation speeds, the probing beams emitted by some of the probes can be "chopped" or pulsed so that phase sensitive techniques can be used to increase the signal-to-noise ratio. In the dynamic mode, there is still a relative motion between the probes and the layer being probed. The dynamic mode, also accounts for any response times that are an implicit part of each probing technique used in the dynamic mode.

Some properties of the layer that are probed include: layer texture, surface roughness, electrical properties, thermal properties, optical properties and magnetic properties. The probes which can be used include electromagnetic radiation—such as X-rays or light, including IR and UV—and various particle beams such as electron beams and ion beams. The probing chamber also comprises at least one detector 58, or at least one array 59 of detectors, for each type of probe. Each detector is connected to the processor 14 by means of the input 22 and transmits a signal to the processor on detection of an event, the processor storing in the memory 16 the information carried by the signal. The processor 14 also processes and directs the signal for display on the screen, therefore providing a real time display of the signal as a map of the layer. Where different probes are operated simultaneously, the signals of each can be displayed on the screen simultaneously.

The probing techniques measure one or more properties of the layer: for example the texture, the composition and other physical properties. Some techniques suited to probe the texture of the layer use: X-rays, ion beams or electron beams. For each of these it is ideal to have a stationary beam impinging on the surface at an 'appropriate angle', with the stationary detectors for reflected or diffracted beams positioned at appropriate angles or positions. Preferably, these techniques are diffraction techniques.

Some techniques suited to probe the composition use X-ray beam or electron beam excitation with detectors at appropriate positions. Those different techniques apply wavelength and energy dispersive analysis, and they are generally well known. Also, Rutherford Back Scattering, which uses an impinging ion beam, can be used to determine the oxygen content of the layer.

Each physical property has different apparatus used to probe that property. For example, for a few of those physical properties mentioned earlier: electrical conductivity requires two contacts to a small area of the layer, measuring the conductivity of the layer between the two contacts; thermal conductivity can be analysed by laser Raman spectroscopy; the texture of a layer can be analysed, for example, by X-ray or neutron diffraction, or electron back scattering diffraction; and the strength of the magnetic field at a particular location can be assessed by means of a Hall probe located close to the surface of the layer or, at higher resolution, by way of "Faraday rotation", through which the rotation of the plane of polarised light under the influence of magnet field is examined. These techniques are, generally, well-known. These techniques can all be used in parallel.

The repairing chamber 48 is used to eliminate some of the defects present in the layer. The chamber 48 comprises a focused ion beam (FIB) device 60, or any other device that applies a method to remove defects present in the layer, and a local layer deposition device 62. The FIB device is fixed relative to the chamber 48. All motion in the chamber 48 is defined in relation to the chamber 48. Each defect, and the parts of the layer surrounding that defect, is positioned, in turn, in the direct path of a beam emitted by the FIB device 60, as the former 6 rotates and translates past the beam. The beam etches away the layer in the locality of the defect, removing the defect. The layer is then positioned in the path of a deposition beam emitted by the local layer deposition device 62, such that the layer is rebuilt. Where the FIB device 60 etches parts of more than one layer, the deposition beam deposits the necessary parts of those layers. The chamber 48, that comprises the FIB device 60, is, in a sense, the "mending tool". The FIB device could conceivably be something else. Typically, alternatives to the FIB device 60 include ablating, etching and lithographical devices that remove defects in an area specific manner.

The coil writing chamber 50 may comprise an ion beam assisted deposition (IBAD) device 64, or other device that can be used for defining a track. The IBAD device 64 is located on a motorised translator 66 giving linear translation 66. The motorised translator is controlled by the processor. The motorised translator 66 and the IBAD device 64 are controlled by the processor 14. The IBAD device 64 is fixed relative to the chamber 50. All motion in the chamber 50 is defined in relation to the chamber 50. As the former 6 rotates and translates past the IBAD device 64, the IBAD device writes a helical path, for example, into the layer to provide the path of the coil track. In this context the helical path has been written (or patterned or defined) as this path is not the coil track that is being written or patterned into a layer, but the calculated path that is being written or patterned into an underlying buffer or metallisation layer. This path, on propagation through successive superconducting layers, forms the coil track in those successive, subsequent layers. In effect, the path in the buffer layer is the direct output of a computed path for the coil track.

An "IBAD device" is a means of writing or defining the path of a textured buffer layer on which a textured YBCO layer is grown. Thus, it can be used to define the superconducting path in the superconducting layer subsequently deposited, and with the benefit that it defines a path to avoid defects etc. Alternatives to the IBAD device 64 include any other writing, defining or patterning device, such an ISD (Inclined Substrate Deposition) process to define the coil track by evaporating material at a defined angle through a defined aperture by a choice of a path, thereby avoiding defects. The IBAD device 64, and its alternatives, lay down substrate in localised areas. Thus, the method that they each apply is area specific.

The coil track defined in or on the layer is substantially helical where the layer has a circular cylindrical shape and the ratio of the rotation and the translation is constant. The coil track of the coil winding can also be created by, for example, "scribing off", "ablating off" or "etching off" the path out of the layer using a cutting tool, such as a mechanical cutter, a laser beam or photolithography process, respectively. The processor 14 can vary the relative motion of rotation and translation of the former 6 to vary the pitch. Thereby varying the angular speed and the linear speed of the former 6, the path of the track can be altered. Finer spiral tracks are cut by slowing the linear translation speed with respect to the rate of rotation of the former 6. However, where the relative motion of rotation and translation are varied whilst cutting a track, such as by operation of the motorised translator 66, the track is no longer helical, but spiral. The width of the track is defined by the size of the cutting tool, or the size of the laser spot in an ablation operation, or a photolithographic operation, lithographic operation or, more generally, a masking operation.

The pitch of the final track defining the superconducting path is generally much coarser than the probe scanning maps referred to above. It might, for example, be a few millimeters wide, instead of perhaps 50 microns wide for a probing light beam. Also, the insulating parts in between the tracks may be the order of one mm. So, a coarser screw thread is used (more translation for less rotation) or another mechanical movement mechanism without the requirement for such high accuracy. For example, the rotating cylinder can be pushed along by a lever of some sort which is in turn actuated by a linear movement (probably again driven by another rotating screw). Alternative mechanisms could be a "rack and pinion" or pulling the cylinder using a wire wrapped around some shaft. The differences between the helical path of the unpatterned layers for mapping purposes by the probes and the coil track defined for the final superconducting paths should be noted. The key difference is the comparative size of the probe path and writing beam diameter relative to the resolution (in the case of mapping) and pitch (in the case of pattern definition) of each coil track, respectively.

The superconducting test chamber 52 is used to ensure the coil track superconducts, and to detect defects in the coil track. A laser spot test is applied to the coil track in the superconducting test chamber 52. The chamber 52 is provided with a laser 80, a pair of electrical contacts 82, and a second motorised translator 86, to provide linear translation. In a modification of the superconducting test chamber 52, a different probe can be used, using a similar spot test, such as an electron beam, provided by an electron microscope.

The chamber can also comprise a commutator (not shown); that is a shaft divided into two or more segments which make contact with each of the electrical contacts 82 (normally brushes). The commutator allows electrical contact to be made with a rotating body, such as the stator coil of a motor. If the coil being tested is intended to be used in a motor or generator, then this commutator would be permanent. If the coil is to be used as a magnet, the commutator would probably be dispensed with later, except in so far as it may act as a way of connecting one layer to another.

The laser 80 and the motorised translator 86 are connected to each other and are each controlled by the processor 14. The electrical contacts 82 are connected to the coil track 82, one contact at each end of the coil track. The temperature of the layer on the former 6 can be cooled to a temperature just below the critical temperature of the material that comprises the coil track. The former 6 is cooled by coolant circulating within the former 6, as described in the European patent application 02 755 238.9.

The laser 80 is fixed relative to the superconducting test chamber 52. All motion in the chamber 52 is defined in relation to the chamber 52. The laser 80 is controlled by the processor 14 to emit a laser beam. The coil track on the former 6 is rotated and translated past the laser 80, across the path of the laser beam. The beam is directed to a spot on the surface of the coil track. The laser beam is directed at a series of positions linearly along the surface of the track. At each position the laser beam illuminates a spot on the surface of the track. Each spot has the same area. As the former 6 rotates and translates past the laser beam, the laser beam falls on every part of the surface of the track, and therefore every spot in turn. The motorised translator is controlled by the processor 86 to line up the beam with the coil track, where the track varies from a substantially helical path.

The laser is used in a perturbing laser spot process, perturbing the current in a localised area in order to detect weak spots in the superconducting track. The wavelength of light of the laser beam is chosen such that a spot of material on which the light is incidental is perturbed in order to probe the material and to determine whether the critical temperature is below a minimum for the material comprising the coil track in the locality of the spot. At the critical temperature, the material in the locality of the spot will flip from a superconducting state into a normal, non-superconducting state.

Various parameters of different probes can be used to determine the threshold of the critical superconducting temperature, also known as the critical temperature of a superconductor, of a spot of material. One parameter of one probe is the intensity of a laser beam. The intensity of the laser beam is fixed and the laser beam is directed to each spot on the surface of the track in turn. A large electric current is passed through the coil track in superconducting conditions. Where the material in a spot is "weak" or "bad", the spot flips into a non-superconducting state upon incidence of a laser beam of a certain intensity with that spot, and the coil track will cease to superconduct, causing a drop in the current conducted by the coil track. That is to say, the intensity exceeds the threshold intensity of the critical temperature for the superconductive properties of that spot.

The resolution of the laser beam is also important. For the laser spot process to work, the width of the laser has to be a sufficient width of the track on incidence of the beam with the track for the test current to vary observably indicative of the presence of defect in the track. That is, the current falls below a chosen current threshold, demonstrating that the spot of the track being tested is defective.

The behaviour of a spot is determined by an ammeter 88 connected in series with the coil track, to detect the appreciable drop in the current passing through the coil track when a spot ceases to superconduct. The ammeter 88 is connected to the processor, so the processor 14 can determine if the threshold intensity is exceeded for each spot, and locate those parts of the coil which weakly superconduct.

Therefore, the weaker superconducting parts of the track will flip at low laser intensities. Those parts of the track require less energy to revert to a non-superconducting state, than those parts of the track that revert at higher intensities. A weaker part of the track, therefore, has a lower critical temperature than that of parts of the track which fail to superconduct with an incidental laser beam of greater intensity.

The intensity of the laser can be varied by means of the set of user controls 20, to determine the critical temperature of each spot, and the quality of different parts of the coil track and the coil track as a whole, to superconduct.

As the size of the laser beam relative to the width of the track is an important consideration, this relationship is closely monitored and controlled by the processor 14 to meet specific parameters, such that the spot covers at least the width of the track. It does not matter if the spot extends a little beyond the width of the track, as there is a gap between one turn and the next turn of the track. The dimensions of the spot are controlled by the processor 14 and by means of the motorised translator 86.

The perturbing laser spot process is a first mode of operation directed to evaluate the spatial physical properties of each spot. The parameters of the laser spot process can be varied to provide different testing conditions and different modes of testing. Such parameters include, for a laser beam, the laser intensity, the critical current, the laser repetition rate, the rate of rotation of the former 6 the spot diameter of the probe and the translation speed of the former 6. Alternatively, the parameters of different probes can be varied to provide different testing conditions and different methods of testing.

An alternative mode of operation is the dynamic mode operation. This is described for a dynamic laser excitation mode and the superconducting test. However, it applies to the measurement of many other physical parameters determined by the probing methods.

In a dynamic laser excitation mode the laser operates in a dynamic mode of operation. That dynamic mode is exactly the same mode of operation as the dynamic mode of operation described for the probes 56 in the probing chamber 46. In the dynamic laser excitation mode, the dynamic parameters, such as the speed of rotation of the coil and the laser repetition frequency, are varied. The dynamic properties of the transition of each spot are related to the quality of that layer, as indicated, for example, by the thermal conductivity of that layer. Therefore, changing the values of the parameters of the test, including the dynamic parameters determines the quality of that layer, and identifies weak areas in the coil tracks.

Another example of a probing technique which operates in the dynamic mode is for the local thermal conductivity variations determined by laser Raman techniques. In these techniques, a spectral shift of a reflected beam depending on the local temperature rise induced by a probing beam is observed. Also, pulsing the probing beam at different repetition rates will result in a different local temperature rise (the heat generated from one pulse takes time to get away before the next) and so on. The dynamic response is often more informative than the "steady state" one. Further, double beam techniques, wherein one beam sets up a steady state and the other beam sets up a small signal perturbation can be used. Double beam techniques are very powerful investigative tools.

Like the probes, the laser 80 has a dynamic mode of testing. In the dynamic mode of testing the response time of the physical parameters, here the stability of the superconducting state, is evaluated. The dynamic mode allows for the application of perturbation techniques which use either "small signal" or "steady state" conditions to evaluate physical properties for the spot interrogated by the laser beam. At slow rotation and translation speeds, the laser beam can be "chopped", or pulsed, so that phase sensitive detection techniques can be used to increase the signal-to-noise ratio.

Figure 5:
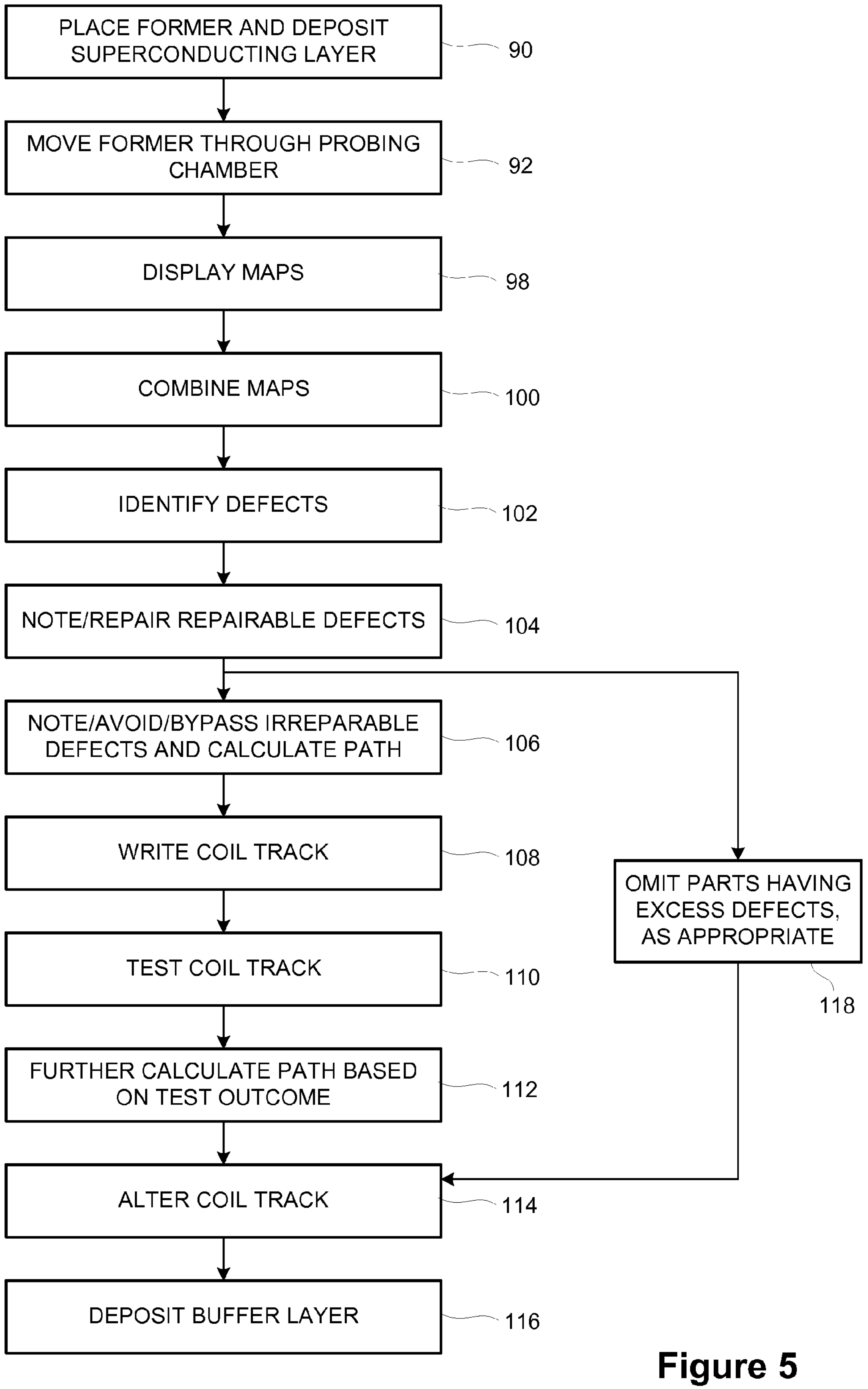
FIG. 5 is a flow diagram showing the process of the testing steps applied to each coil track.

The process followed in the apparatus has a number of steps, during which the successive coil tracks in a coil made from YBCO are fabricated and tested. This process is shown in the flow diagram in FIG. 5.

The fundamental test is passing a current through the coil track, which is known as electrical testing. Failure, or a reduced ability of the coil to conduct is indicative of a defect. One method which applies electrical testing, and which would be fast in the location of defective areas, is a binary search method, using moveable brush contacts, which is used to detect catastrophic defects in the track where the coil track can not superconduct at all. This method may require physical contact with all parts of the track. The brush contacts are initially placed at either end of the coil track and a current passed through the coil track and brush contacts. If the coil track fails to superconduct, the binary search method is used to identify those parts of the track that do not superconduct. That is, one brush is left in contact with one end of the track, and the other is moved to contact the midpoint of the track. If the half of the track between the contacts of each brush fails to superconduct, the length of the track between the brushes is gradually reduced by repeating the movement of the brushes to the midpoint of the track between the two previous contact points of the brushes on the track. Clearly, if the length of the track between the brushes superconducts, that length of track must not contain any defects.

A further method that is used to determine whether the track superconducts is the laser Raman technique. The laser is directed at each spot and perturbs the material in each spot to probe the thermal conductivity of that spot. This technique is carried out at room temperature, but is an accurate assessment of the superconducting properties of materials, like YBCO, at low temperatures. It is also saves having to cool the coil track to temperatures at which the coil superconducts.

Another technique that is used to test the superconducting properties is ellipsometry, which measures local variations in the refractive index of the coil track. Also a Hall probe can be used to detect the magnetic field, by measuring the strength of the magnetic field at particular locations relative to the coil track, thereby providing a map In a first step 90, the former 6 is located in the deposition chamber 44, and a superconducting layer is deposited on the previous buffer layer. The texture of the buffer layer propagates through the YBCO layer. The former 6 is then moved into the oxygenation chamber to alter the oxygen content of the layer to improve the superconductive properties of the coil track formed in the layer.

In a second step 92, the former 6 is moved through to the probing chamber 46, in which the probes 56 scan the whole of the surface of the deposited layer. The former 6 is located relative to the chamber 2, the probes 56 and the detectors 58 by means of a series of optical shaft encoder sensors 94 (which indicate the angular position of the former 6) and by a series of position sensors 96 (which indicate the lateral position of the former 6 relative to each probe 56). Each optical shaft encoder sensor 94 and each position sensor 96 send signals to the processor 14. The processor 14, thus, is able to process the signals emitted by the optical shaft encoders 94, the position sensors 96 and the detectors 58, to identify the defects present in the layer and their exact location. That processed information for each probe and detector pair 56/58 is stored in the memory 16 as an electronic file.

The probes 56 and detectors 58 will generally be fixed relative to the chamber 56. It is the lateral and angular positions of the former which need to be determined by the linear positioning sensors and the shaft encoders respectively. Furthermore, if the cylinder is positioned by a lead screw device, then the lateral position of the cylinder is determined by the number of turns, (including a fraction of a turn) of the lead screw. This assumes a "zeroing" operation is applied before the turns are counted. This lateral position will be accurately determined if a lead screw is used in combination with the shaft encoders. For other mechanical movements giving linear translation, then linear position sensors will be used. There are many different types.

In a third step 98, the electronic file for each probe 56 can be displayed on the screen 18 as a map. The map provides an image of the features of the surface of the layer as detected by the corresponding probe 56, each feature representing a variation of the physical property detected by that probe 56. The user can alter threshold values for each map that indicate different properties indicative of a defect. Therefore the map can reveal different types of defect, and indicate the severity of the different defects. The maps, corresponding to different probes, may be colour coded for closer examination by the operator. Therefore, an operator can influence the scanning by acting upon the maps presented on the screen 18.

In a fourth step 100, the maps of the layer are combined to provide a composite map by means of algorithms contained in the software. The various maps are combined by weighting the value of each map relative to each other map. The weighting of each map is predetermined, but may be altered by a user. Specific weighting values are used in different conditions, such as: with different materials in the layer, and different forms and geometry of the coil path, different positions in the coil and different final applications. In a coil intended for a motor, the magnitude of the current passing through the coil track is more crucial than the precise geometry of the produced magnetic field; whereas in the case of a magnet, the precise magnetic field shape produced by the coil track is more important than the precise value of the current. The weighting to form the composite map can therefore account for such differences. The maps enable defects to be located and identified. The composite map identifies and locates each defect present within the layer with greater accuracy than an individual map used alone.

In its simplest form, the composite map will be formed by simple addition of the individual maps with weighting factors. In a more complex form, combinatorial versions will be used, for example, a term may be a multiplication product not an addition or subtraction.

The value at any point 'p' of a simple composite map, which is created by the addition of the individual maps can be written:

$$V(p)=A(p)\cdot w1+B(p)\cdot w2+C(p)\cdot w3+\ldots,$$

where A, B and C etc. are values from the different probing techniques and w1, w2, w3 etc. are different weighting factors, positive or negative.

A composite map, which is created using a combinatorial method, would include cross-product terms as follows:

$$V(p)=A(p)\cdot w1+B(p)\cdot w2+C(p)\cdot w3+\ldots+A(p)B(p)z1+A(p)C(p)z2+B(p)C(p)z3\ldots,$$

where z1, z2, z3 etc. are other weighting values for the cross product terms. The essence of it is that one might tolerate defects in the maps of certain parameters, but when combined with the defects in the maps of other parameters then the situation might get more difficult to avoid or repair, such that the defect may even become catastrophic. Defects in different positions for different maps also lead to a distinct decision. For example, a weakly superconducting region in the nth YBCO layer at point x, y combined with a surface roughness problem with the (n+1)th buffer layer in a neighbouring region may lead to the decision to avoid that area in future patterned YBCO layers.

The defects present in the layer can be of two types: those that will not propagate through successive layers; and those that will propagate through successive layers. Furthermore, each type of defect, is either repairable or irreparable. The propagating defects are "memory effect" defects, that propagate through different layers by virtue of size or crystallography. For example, some large a-axis orientated grains cannot be overgrown and will give rise to defects in subsequent layers in that area of the coil. Non-propagating defects include small inclusions, such as a precipitate or a contaminant of some sort which may be overgrown in future layers. Another source of defects are point defects, vacancies or interstitial atoms, within the crystal lattice of the layer that are not required for the high temperature superconducting material to work. Line defects (such as dislocations) and planar defects (such as grain boundaries) are progressively larger structures which can give rise to problems. Non-propagating defects may well be overgrown in subsequent layers, such that the corresponding area in successive layers is not defective. Therefore, not all irreparable defects are propagating defects. The term "irreparable" designates those defects which need not, or cannot, be repaired or which would be easier to avoid, as described in a sixth step 104 of the process.

In a fifth step 102, the defects are identified by the processor 14 as repairable or irreparable type defects and, those that are irreparable, whether they are propagating or non-propagating defects. A record of the nature of each defect is stored in the memory 16 in relation to the composite map.

In the sixth step 104, the location of each of the repairable defects in the layer (those defects in the layer that are easy to repair or will propagate through successive layers and are reparable) are noted by the processor 14. The processor 14 controls the motor 42 to move the former 6 into the repairing chamber 48. The processor 14 then controls the motor 42, the FIB device, or other repair device, 60 and the local layer deposition device 62 in order to repair the repairable defects in the layer.

In a seventh step 106, the location of each of the irreparable defects in the layer (those defects that have not been repaired in the repairing chamber 48) are noted by the processor 14. The processor 14 then computes a path for the track by a "optimal path analysis" that avoids or by-passes the "weak" areas of the YBCO layer that have irreparable defects; and couples the other areas of the YBCO area in series. That analysis calculates an optimal path for the superconducting coil track. The processor identifies a number of different paths to optimise performance of the coil track, and therefore the superconducting current.

Having calculated a number of different paths, the geometry and shape of the magnetic field distribution is calculated. Well known finite element techniques can be used for this calculation. Such techniques are embedded into specific readily available software, such as the product "Vector Fields". If an unwanted inhomogeneity develops in the calculation, another suitable optimal path can be chosen for subsequent layers to cancel out this tendency. The calculation of the optimal path is suited for the testing of coils for applications such as in high field NMR.

In the optimal path analysis, account is taken of the exact shapes of the electric and magnetic fields associated with the calculated optimum path. These field shapes can be calculated for the coil track from a) the current flowing through the coil track and b) the geometry of the path of that coil track. Different applications of the coil track require different tolerances for the shape, or form, of the field generated by the coil track. For example, for very high field NMR coils, the field is ideally uniform and accurately known; whereas, for a superconducting energy storage magnet (SMES) or an electric motor, the uniformity and the exact size of the shape of the produced field is not critical. Therefore, the coil track for an application requiring a uniform field will need more rectification to adapt the field generated by the coil track than a coil track for an application that does not require a uniform field. This assumes both coil tracks have the same number and type of defect.

Therefore, where the coil track is one track in a coil having a plurality of coil tracks, the shape of the field generated by each of those coil track needs to be incorporated into the calculation of the optimum path of the track. That variation to the calculation enables the shape of the field produced by the coil to be adapted to the shape required for the intended application of that coil, as the coil is created by the formation of the consecutive coil tracks.

For an application such as a motor winding there may well be an external field from an external coil or from a permanent magnet. This shape of this external field is also incorporated into the calculation for the optimum path. Further, for some applications it may be possible to correct the shape of the field with "field shaping" coils, which may be external and can be included in the calculation.

One method of the calculation to incorporate external elements in the calculation is an iterative procedure, where the shape of the field formed by the coil track and underlying coil tracks comprising the coil is calculated without accounting for the shape of the external field. The shape of the external field is then introduced into the calculation and the calculation repeated.

In an eighth step 108, the processor 14, by means of the motor 42, moves the former 6 into the coil writing chamber 50. The processor 14 then controls the IBAD device 64, the motor 42 and the motorised translator 66. The IBAD device 64 writes the optimum path into the YBCO layer to provide each coil track. The path avoids all the irreparable defects identified in the seventh step 106. In this step, instead of the IBAD device 64, any other device that applies a method to define a coil track, can be used.

In a ninth step 110, the processor 14 controls the motor 42 to move the former 6 into the superconducting test chamber 52. The processor 14 then controls the electrical contacts 82 to connect to each end of the coil track and pass current therethrough. The temperature of the superconducting test chamber 52 is regulated by the processor 14 controlling the circulating the coolant in the former 6. The processor 14 controls the motorised translator 86 and the laser 80 to direct the laser beam at each spot on the surface of the track. The processor 14 processes the signals received from the ammeter 88 and the laser 80. The ammeter 88 indicates the superconducting current. The laser 80 indicates the intensity of the beam directed at the spot. Together these two signals indicate if the threshold intensity, at which the material comprising each spot becomes non-superconductive, has been exceeded for each spot. Alternatively, another threshold test, for example a probing the strength of the magnetic field at various locations relative to the coil track, is used to determine the quality of the superconducting properties of the superconducting coil tracks.

In a tenth step 112, the processor 14 processes the information received from the ninth step 110 to compile a map indicating the quality and the location of "weak" areas of the track that poorly superconduct for each of the techniques used. The processor also combines those maps to provide a composite map of the path of the coil track. The various maps are weighted according to their relative importance. The processor then calculates a path by an iterative process, preferably by finite element analysis, selecting a more optimised coil path. This iterative process is especially important when adapting the shape of the field as a consequence of external fields.

The processor 14 can identify weak parts of the coil track from those maps of the path (including the composite map) that need further alteration to improve the coil track by repair or avoidance of defects, or can decide that that part of the coil track should be abandoned. The various maps are also displayed on the screen 18. Again the user can alter threshold values for each map that indicate different properties indicative of a poorly superconducting part of the coil. Therefore the maps can reveal different degrees of superconductivity in the coil track, and indicate the severity of the poor superconductivity of those weak areas of the track.

In an eleventh step 114, the processor 14 controls the motor 42 to move the former 6 to the coil writing chamber 50 and the repairing chamber 48, as required, to make the alterations to the coil track. The testing and repairing steps (the ninth step 110 to the eleventh step 114) are repeated until the coil track is defect free, sufficiently uniform or is able to superconduct. That is, testing and amendment cease when the fabrication is abandoned or when the coil meets the specifications required for its intended application. Where at least a part of the coil track is abandoned, the repairing steps also include the connection of parts of the coil track that are not abandoned by way of at least one interconnection, creating a continuous winding where, otherwise without the connection of the unabandoned parts, the coil track would be incomplete and discontinuous.

Once testing and amendment cease, a metallic overlay is placed over the coil track by means of an evaporation deposition technique such that the overlay is in contact with the coil track. The metallic overlay, also known as a metallisation, acts as a shunt for the current in the event of a superconducting quench or an overload of the underlying coil track. A typical scenario where the overlay is used is where the superconducting coil track ceases to superconduct dues to overheating local to that coil track. The overlay takes, and directs, the current away from that coil track for at least a short time, acting as a current safety valve. Further, the metallised overlay assists marginally weak areas to conduct the current, when the coil track superconducts. The metallised overlay also has other functions, such as a heat sink, dissipating heat from local hot spots on the coil track. It must also be textured if further layers are to "copy" the texture in a multi-layer structure. Thus, the metallisation layer should, generally, propagate and transmit the texture from the layer on which it is deposited through to the layer which is deposited on it.

The overlay would be typically made of gold or silver or an alloy of these. The choice of these materials is dependant on whether the oxygen should sealed into the underlying coil track, or whether the oxygen should be allowed to diffuse through the overlying layer. Gold acts as a seal and silver allows oxygen to diffuse through it. The choice of element also depends on the position of the coil track in the layer, inner layers of the coil may receive more heat treatments than the outer layers, as the coil structure is built up.

In a step 118 parallel to the seventh step 104 to the eleventh step 114, the processor 14 identifies if the layer comprises too many defects to be repaired, and identifies if at least one part of the layer should be avoided. Those parts of the layer that have too many defects, are omitted from the coil track of that layer. Of course, the effect of omitting part of the layer from the coil track is accounted for in the calculation of the optimum path of the coil track, which includes the shape of the magnetic field produced by that coil track and the coil comprising that track. If the layer has too many defects, the whole layer is abandoned and the process proceeds to a twelfth step 116.

In the twelfth step 116, the former 6 is returned to the deposition chamber 44 for deposition of a buffer layer and the first to eighth steps of the process are repeated. If the buffer layer does not require a coil path to be defined into or onto the layer, the process omits the seventh and eighth steps of the process. Like the buffer layer, if the layer comprises too many defects, the parallel step 118 is followed. Although the coil track will propagate through to the buffer layer from the coil track of the previous layer, the buffer layer is deposited such that it does not take up the texture of the previous layer. After the buffer layer has been deposited and repaired, the next YBCO layer is deposited.

Figure 6:
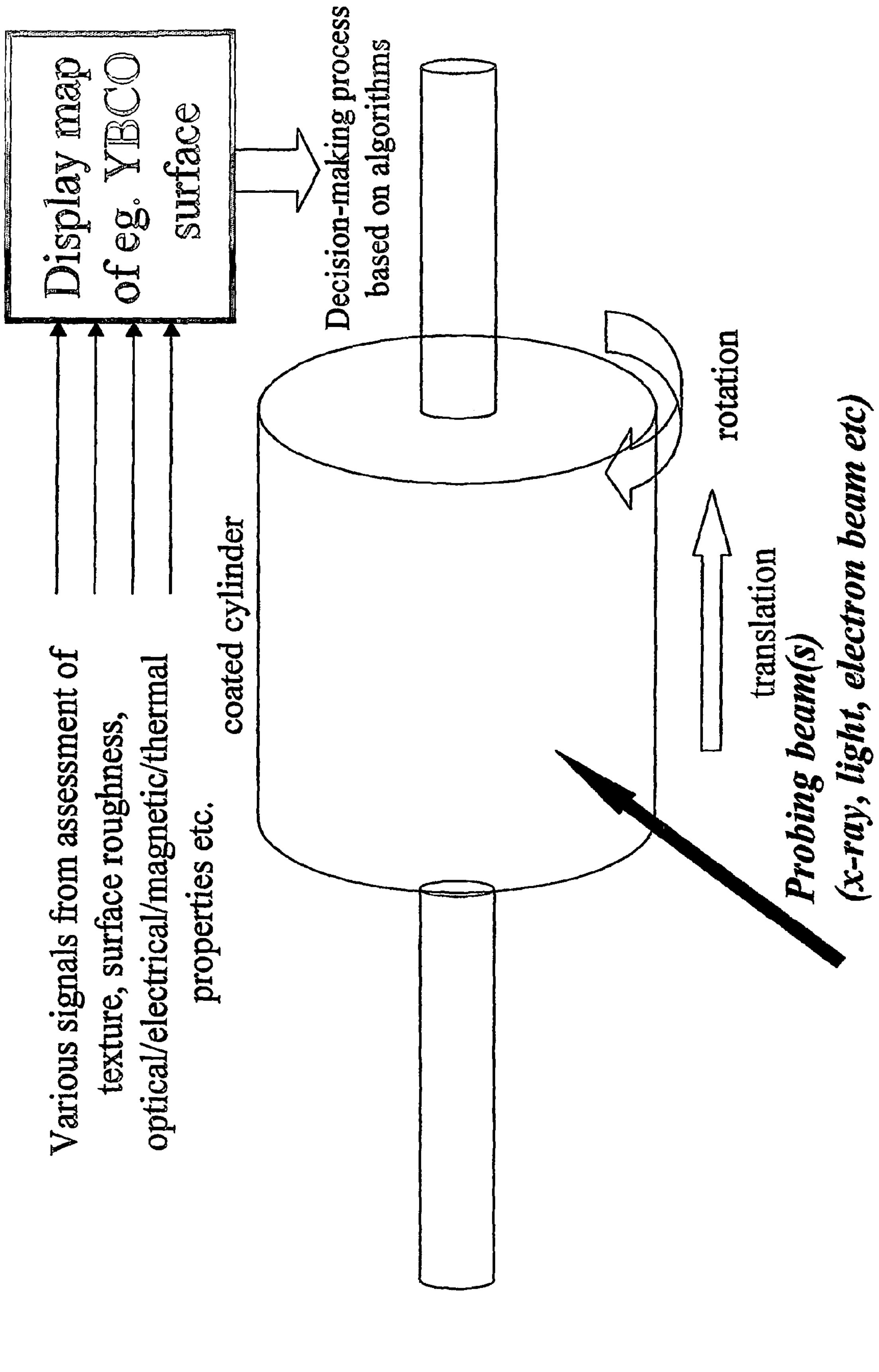
FIG. 6 is a schematic representation of parts of the apparatus showing the interrelationship of the apparatus with some stages of the process shown in FIG. 5.

FIG. 6 shows a schematic representation of the former 6 on the frame 26, showing the steps of the process as previously described.

The apparatus and process described above are only of one preferred embodiment, applied to one form of superconducting coil track.

In a modification of the preferred embodiment, an IBAD beam deposits textured material on the former 6 and then depositing another layer, such as YBCO, uniformly all over the surface. The texture freely propagates from an underlying into a new layer. Therefore, where the YBCO is textured—i.e. where it is positioned above the textured layer the YBCO will superconduct. In between the turns of this coil track, the YBCO will be comparatively non-superconducting—two orders of magnitude or so less—because this YBCO is non-textured. The YBCO in between the highly superconducting turns will carry comparatively little current—acting almost as insulation isolating the adjacent "turns". Therefore, the path of the first underlying coil track is also propagated to through subsequent layers. The fabrication process to make this type of coil is described in further detail in the European patent application 02 755 238.9.

If the path of the coil track is so irregular that the coil fails to provide a useful magnetic field, or is unable to conduct sufficient current, the next buffer layer is deposited. If the path in the new buffer layer is not an improvement of the path of the coil track in the previous layer, and the new layer would provide a track in a subsequent superconducting layer that would not provide a useful magnetic field, a new initial textured buffer layer is deposited. The new initial textured layer allows a new path to be defined into or onto that layer. Coils fabricated by this process are suited for applications where shape of the magnetic field produced by the coil does not have to be uniform, and the strength of that field does not have to be known.

In a modification to the preferred embodiment, the process and the apparatus can be adapted to enable the testing step to be used in the fabrication process of different coil types.

Figure 7:
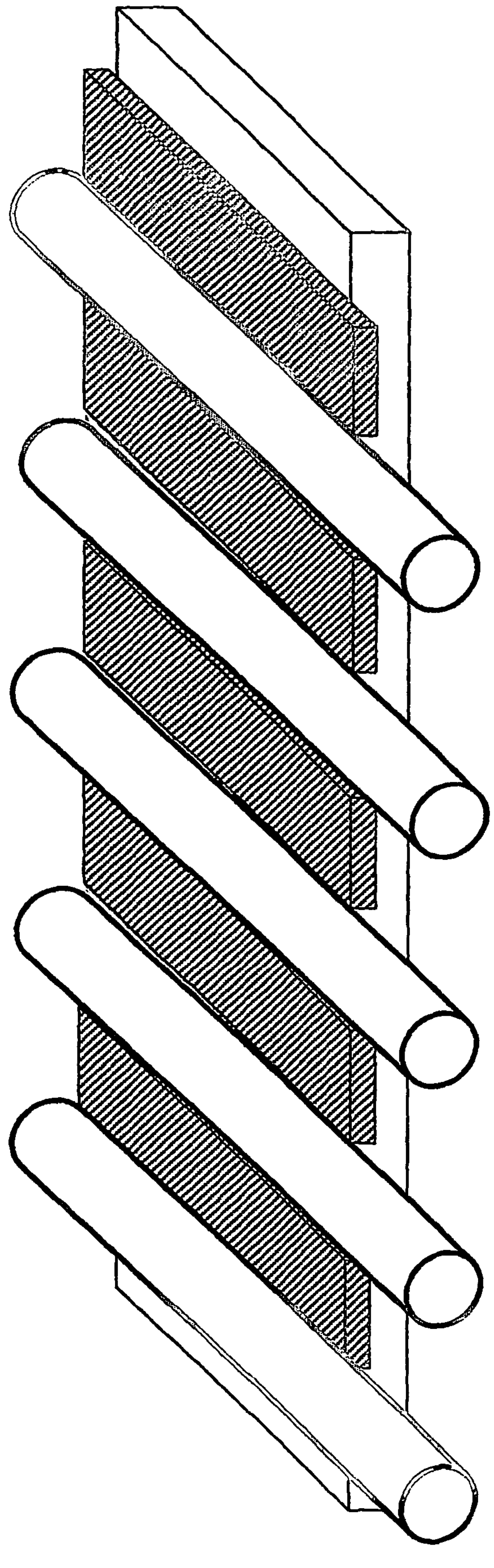
FIG. 7 is a schematic representation of an alternative way of forming a coil track using masking.

By way of example, in a second preferred embodiment, the coil is created by depositing the buffer layer and subsequent YBCO and buffer layers, as shown in FIG. 7 and as described fully in the European patent application 02 755 238.9. The testing process applied to this type of coil is a process similar to the eighth to eleventh steps of the preferred embodiment, with the perturbing laser spot mapping the weak links in the track of each coil track.

In a modification of the above described embodiment, the scanning configuration can be modified such that the former surface is scanned with a small probe (therefore higher resolution) more quickly than a standard probe. In this modification, each probe has a lateral oscillation during the rotation and translation of the former 6.

This embodiment applies the two independent linear motions which are preferred in some circumstances. This modification assists to preserve high resolution scanning without a very tedious slow translation of the cylinder through the chamber. With a very small probe, for high spatial resolution, the former 6 needs to pass the probe very, very slowly (using, for example, a feed screw with a very fine thread) or a lateral oscillation of the probe is introduced which allows mapping at high resolution, but permits the former 6 to linearly translate at higher speed. The lateral oscillation and accompanying measurement must be accomplished fast otherwise the former 6 would have rotated to another position and the resolution will be degraded in the rotation direction.

As a further embodiment of a binary search test applied to a coil track, the contacts are fixed to the either end of the coil, and the track is illuminated or stimulated by a flood beam. At the beginning of the search, the whole track is illuminated by the flood beam. As the search progresses the portion of the track illuminated, or stimulated, is gradually reduced using the binary search principle.

In applying this method to a coil track, the coil is held, using precision temperature control, or an external magnetic field, near the critical condition. The critical condition is a condition in which a small perturbation of a) temperature b) current or c) magnetic field can "flip" the superconductor into its "normal", i.e. non-superconducting state. That is, the critical condition for a superconductor is a function of temperature, current and magnetic field. This concept applies to the other tests of the superconductive properties of a track herein described.

In the course of a search using, say, a laser beam, a temperature rise in the track is locally introduced, which will have a considerable effect of the current in the track since it is near its critical condition when the test starts. In the case of the "flood illumination" test, considerable portions of the track are being simultaneously excited, with the advantage that the binary search technique, and its speed, can be used to locate a defective area. Also, the test has the advantage that it is not necessary to move the contacts in order to undertake a fast binary search. Similarly, a magnetic field could be used to bathe the coil or parts thereof. Of course, the coil is spun around whilst these tests are carried out.

The laser perturbing spot process described in the preferred embodiment of the superconducting test chamber can be modified further. A first further modification is to use a double beam technique whereby a steady state laser beam, and a pulsed laser beam is superimposed over the steady laser beam to generate a signal.

A second further modification is the "flip side" of the preferred process, whereby light illuminates the whole of the coil track except for a dark spot which scans the surface. The dark spot is produced by a mask in front of a "flood beam" of illumination, so that the shadow of the mask was the dark spot. It might also be a "line" produced by the shadow of a wire.

To appreciate this modification, it is sometimes useful to think about things "upside down" or the "negative" in the sense of photographic negative. For example, a "threshold level" can be approached from either above or below. An impinging beam, or indeed "flood illumination" is likely to reduce superconductivity but there may be special cases where it acts the other way around, and a scanning dark spot is a better technique.

The coil fabrication techniques referred to above will, generally, use a substantially cylindrical former 6. As a modification of this testing technique, the testing steps herein described can be applied to coils manufactured upon any curved surface, including a saddle, a cone, a surface having a concave rather than a convex surface, a surface with negative curvature rather than a surface with positive curvature and a surface that does not have an axis of rotation. Consequently, the path of each coil track is varied, not only to provide a required field shape, but to avoid defects in the corresponding layer. Therefore, the path of the coil track is not limited to a helical or spiral type path, although the preferred embodiment is a helical track on an essentially right-circular cylindrical former 6. In this configuration, the coaxial symmetry makes the processing and testing steps very easy. A spiral track is provided as a modified embodiment where the pitch and width of the track varies along the length of the former 6. A spiral winding with a decreasing radius is a further modified path of coil track.

A further modified coil path is commonly used in coils for motors and generators. The path defined into or onto the layer is comprised of a series of parallel thin tracks, parallel to the axis of the cylindrical former 6, along the length, from end-to-end, of the former 6, all over the surface of the layer. The linear tracks are all interconnected. One such embodiment of this modification is a spherical former 6, or an oblate former 6, such that the coil track is continuous, and the connections between the linear tracks go along the curved surface of the former 6, but parallel to the axis, and on the end faces of the cylinder. Thus the path of coil tracks of motor and generator coils are more complex. This complexity also is modified to account for stator coils and field coils, each requiring a different path of coil track. As one of these two coil types will rotate in service, coaxial symmetry assists with the production of that rotating part.

Figure 8:
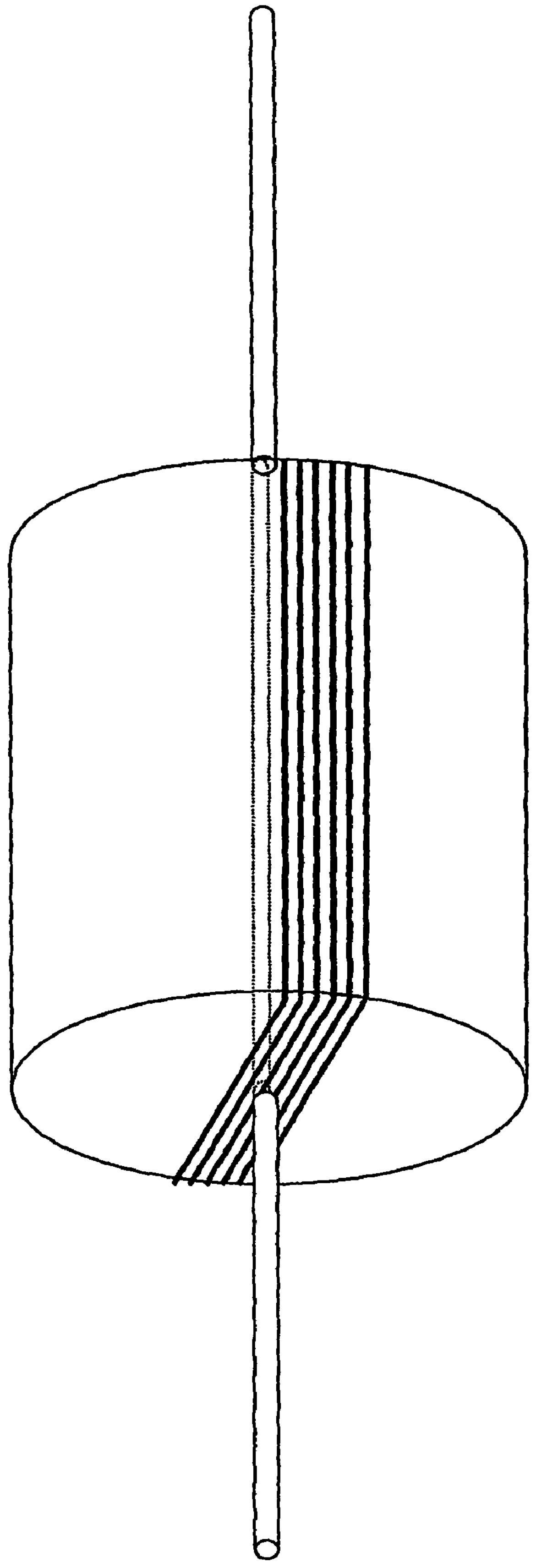
FIG. 8 is a schematic representation of a superconducting coil following a non-helical path.

Thus the coil tracks need not follow a helical path. FIG. 8 shows a schematic representation of another coil configuration in which the axis of rotation is different from the axis of rotation of the former. In FIG. 8 the coil tracks run parallel to the axis of the cylinder. Normally, such an armature contains several coil windings, distributed around the cylindrical surface and connected either in parallel or series. This figure shows just one winding for clarity.

Such a track would be easy to produce using the scanning systems and basic methodology used in the fabrication of helical coils described elsewhere in this application. The discontinuity of the track between the curved surfaces and the end faces may be handled using joins, or connections.

In a modification of this track configuration, the cylinder is a spheroid or an obloid shaped former without sharp discontinuities to bridge, by way of a connector. An additional scanning direction is required to handle the end portions, but this can be accomplished with a beam scanning device of some sort, such as a "flapping mirror". Alternatively, the required pattern can be "projected" onto the end face using a light source, projection mask and projector lens system.

Typically, the coil configuration shown in FIG. 8, a stator coil, can be used in a motor or generator. Conventional motors/generators will very often have "commutators" which allow contacts to be made to a rotating part. This is usually accomplished using "brushes".

The process of the preferred embodiment is modified whereby the weighting of the different probe maps can be varied in order to detect different types of defects for different materials comprising the superconducting layer, and in order to direct the fabrication of the coil to its intended application, such as electrical machines and magnets.

Although specific materials, namely YBCO, have been referred to for use as the superconducting layer, any material—particularly $MgB_2$ or ReBCO (of which YBCO is a common example, as Re denotes rare earth element)—which, as a film exhibits excellent high temperature superconducting properties, could be used in the manufacturing processes, and articles herein described. Typically such a film is, and is known as, a thin film.

Similarly, any material which exhibits the physical properties of a buffer layer can be used to form a buffer layer in the manufacturing process and resultant articles herein described. It is also common to have more than one buffer layer beneath the superconducting layer.

In a modification to the process, the deposition of the metallised overlay is deposited at another stage of the testing step, such as before the writing of the coil track onto the layer. The metallisation layer should also be textured, to ensure that the "copying" process can be continued in the multi-layer structure. Thus, the metallisation layer should, typically, propagate and transmit the textured pattern from the layer on which it is deposited through to the layer which is deposited on it. In order to propagate the texture, the metallisation layer also needs to be tested to ensure that it, too, does not comprise a defect that would prevent superconducting layers, that are subsequently deposited on the metallisation layer, from superconducting. Preferably, the metallised layer is a film.

The apparatus, and consequently the method can be adapted to comprise any number of required chambers, each chamber having a process occurring within it. After each step in the process, the former 6 moves between constituent chambers of the chamber 2. The former is moved to a chamber in either direction; the chamber to which the former is moved need not be adjacent to the chamber that the former is leaving, for the next step in the testing process. Further, the configuration of the chambers can be adapted to suit the size and shape of the former 6 used. Furthermore, the apparatus can be arranged such that a number of coil tracks, each on a different former are tested simultaneously, in parallel production lines.

In a further modification to the apparatus, the apparatus comprises a probing chamber 46 for each type of probe 56. In an alternative embodiment, there is more than one probing chamber and each probing chamber has at least one type of probe 56.

In a further modification one chamber can be used to carry out more than one step of the process, such as deposition of the buffer layer and x-ray composition mapping. Further any number of the steps of the preferred process can be carried out in a chamber modified to carry out those steps.

In a further modification of the various probing techniques used in the superconducting test chamber 52 and the probing chamber 46, the probes 56 and detectors 58 are modified to provide an array of probes and detectors to probe a particular property of the layer or the coil track. For example, for optical properties, several light beams and several detectors can be used to map or to image the surface of the layer.

The apparatus is not limited to the form described in the preferred embodiment. Any apparatus in which there is a simultaneous rotational and translational relative movement between the former 6 and a fixed device located in a chamber can be used for the processes herein described.

The processor is not limited to the embodiment herein described, but can be any processor, including, for example, expert systems which incorporate fizzy logic and or neural networks. The invention is not limited to the embodiments herein described, but may be in various combinations of the described features and modifications, together with immaterial variations.

Figure 9:
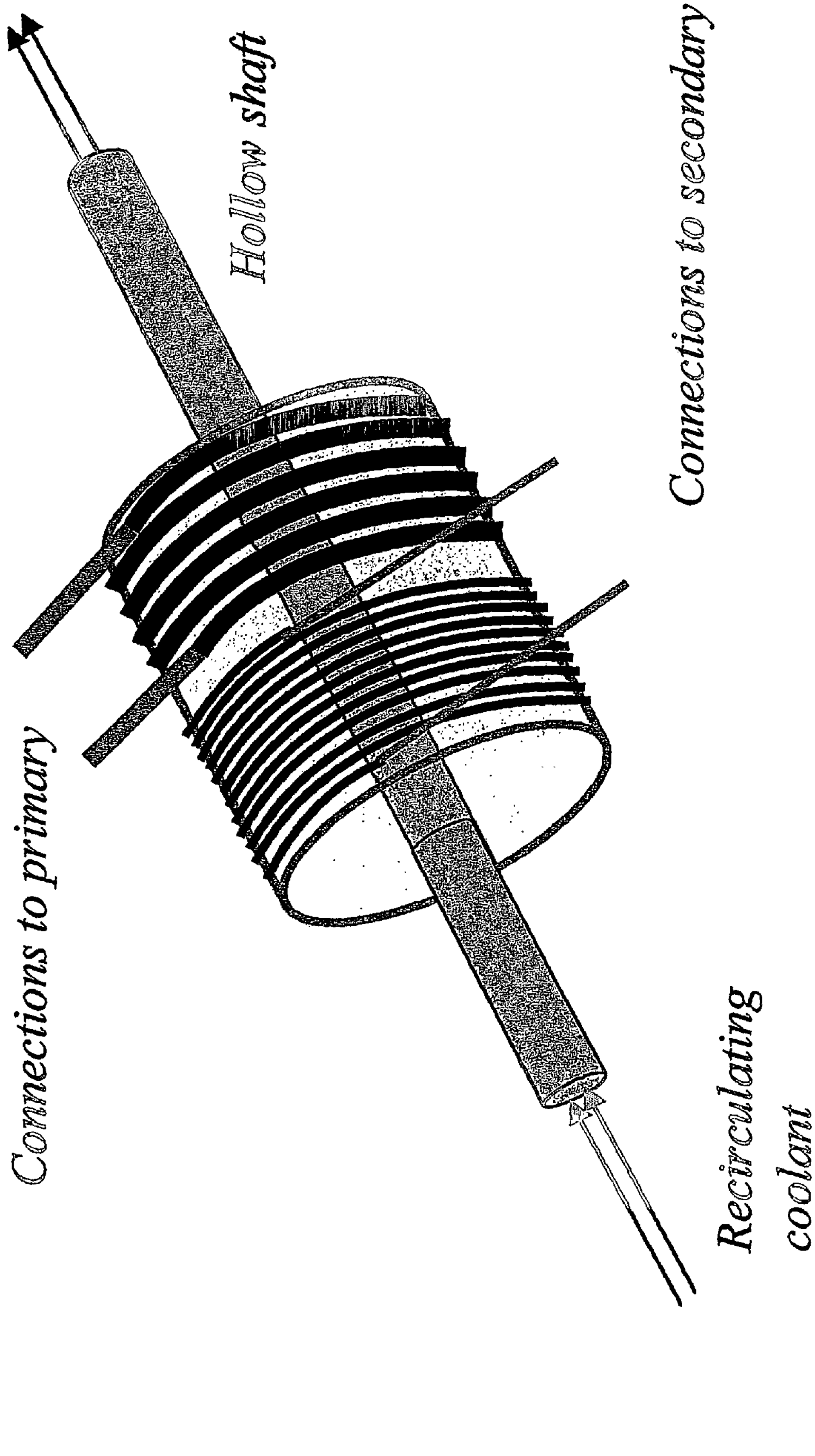
FIG. 9 is a schematic representation of a former having two coils, each coil having a different geometry

The methods described here can be used to fabricate and to test multiple coils around the same former. FIG. 9 shows a simple configuration of two coils around a former. More than one coil can be formed on the former, with at least one coil having a dissimilar geometry to the other coils. The coils can be side by side, on top of each other and integrated with each other. Typical applications include step-up and step-down transformers, and resistive or inductive FCL (Fault Current Limiter) devices, including a FCL transformer.

One application of a coil made by the methods and techniques herein described is a “linear motor” which can consist of a number of hollow coils of the original “helical” design in line with each other and activated sequentially so as to act on an internal body to move it through the system in a straight line. A launcher could be built using this principle, or it could provide the basis for a transporter—e.g. Maglev train.

The concept of hollow coils is important e.g. for magnets also, and for the field windings of motors and generators. Thus, it is possible to fabricate windings on an external former inside which there is a rotating body—such as a stator coil of a motor or generator. On the other way around, whereby the outer cylinder is the one which rotates.

Electrical machines may be built using a plurality of the coils described herein. For example a SMES (Superconducting Energy Storage Magnet) may consist of many essentially cylindrical magnet coils. Similarly a motor may actually consist of many such motor coils—compare this with a modern internal combustion engine which has many identical cylinders and pistons, not just one cylinder and piston combination.

There are a number of important consequences of this testing method, to the fabrication process incorporating this in-situ testing methodology:

1) each coil track does not merely pass or fail the testing step, but can be repaired and altered to avoid defects and enhance the coil which it comprises;

2) field profiles or shapes can now be corrected, cancelling out non-uniformities by appropriate computation of the optimum path of the tracks;

3) long substrate tape lengths, and wasted long lengths of metallic tape are eliminated, particularly for axially rotatable (cylindrical) geometry, eliminating energy losses associated with that substrate, (usually resulting in heat dissipation, arising from the application of varying electric and magnetic fields in materials); and 4) the dynamics of film deposition processes, more specifically thin film deposition processes, can be easily varied by changing different rotational speeds for different processing steps and conditions, such as the process where the layer undergoes oxygenation.

The invention claimed is:

1. A method of fabricating a track in a layer of thin film material for use in a superconducting coil, the layer provided on a former having a substantially curved surface, the method comprising:

scanning the layer to detect defects in the layer by probing a physical property of the material comprising the layer, without a coil path being defined in the layer, to provide a data set of the physical property;

processing the data set to form a map having features indicating variations in the physical property over the layer;

analyzing the features of the map to identify and locate defects in the layer;

for each of the defects, identifying whether the defect is irreparable;

calculating an optimal path, wherein the path avoids any irreparable defects; and defining the optimal path in the layer to define the coil track.

2. The method as claimed in claim 1, wherein the method further comprises:

for each of the defects, identifying whether the defect is a repairable defect; and repairing each repairable defect.

3. The method of fabricating a track as claimed in claim 1, wherein calculating the optimal path includes calculating a plurality of different paths to optimize the performance of the coil track once defined in the layer and choosing the optimal path from the plurality of different paths.

4. The method of fabricating a track as claimed in claim 3, wherein calculating the optimal path includes choosing from the plurality of different paths another path as the optimal path, if an inhomogeneity develops in the calculation.

5. The method of fabricating a track as claimed in claim 4, wherein calculating the optimal path includes computing a path that avoids each weak area in the track that has an irreparable defect.

6. The method of fabricating a track as claimed in claim 5, wherein calculating the optimal path includes coupling other, non-weak, areas of the layer in series.

7. The method as claimed in claim 1, wherein calculating the coil path comprises adapting the path of the coil track such that the coil track produces a magnetic field that is predetermined.

8. The method as claimed in claim 7, wherein adapting the coil path to rectify the shape of the field produced by the coil track also accounts for each field produced by each other existing coil track that comprises the coil.

9. The method as claimed in claim 7, wherein adapting the coil path to rectify the shape of the field produced by the coil track also accounts for each field external to the coil.

10. The method as claimed in claim 1, further comprising abandoning each part of the layer that has too many defects to be repairable or avoidable, or that would be easier to abandon than to repair or to avoid.

11. The method as claimed claim 1, wherein scanning comprises a plurality of probing steps, a different physical property of the material being probed during each probing step, each different physical property having a data set processable to form a map.

12. The method as claimed in claim 11, wherein each map is combined with one or more of the other maps to provide a composite map.

13. The method as claimed in claim 12, wherein each map is weighted relative to each other map when combined to provide the composite map.

14. The method as claimed in claim 1, wherein the layer is a thin film of super-conducting material, and scanning further comprises testing whether the coil track superconducts.

15. The method as claimed in claim 14, wherein testing uses a binary search method thereby locating a part of the coil track that does not have predetermined superconducting properties.

16. The method as claimed in claim 15, wherein the binary search method uses contact brushes that are moved in an iterative procedure to locate the or each defective area.

17. The method as claimed in claim 16, wherein the binary search method uses a probe to perturb the superconductive properties locally.

18. The method as claimed in claim 17, wherein testing uses a probe spot method thereby locating a part of the coil track that does not have predetermined superconducting properties.

19. The method as claimed in claim 14, wherein testing uses a dynamic testing technique locating a part of the coil track that is non-superconductive, the dynamic testing technique being dependent on at least one dynamic variable.

20. The method as claimed in claim 19, wherein the at least one dynamic variable is a speed of rotation of the former divided by a probe repetition frequency.

21. The method as claimed in claim 14, further comprising producing a result from the testing indicating whether the coil track superconducts, the result being portrayed as a map of the coil track, the map indicating each part of the coil track that has poor superconducting properties, and a location of each part of the coil track that has poor superconducting properties.

22. The method as claimed in claim 21, further comprising abandoning a part of the coil track that has poor superconducting properties.

23. The method as claimed in claim 22, further comprising interconnecting those parts of the coil track that are not abandoned.

24. The method as claimed in claim 21, further comprising repairing a part of the track that has poor superconducting properties.

25. The method as claimed in claim 1, wherein the layer is a buffer layer or a metallization layer.

26. The method as claimed in claim 25, wherein the coil track is formed in a subsequent layer.

27. The method as claimed in claim 1, wherein the former defines a substantially right circular cylindrical surface and the coil path defines a substantially spiral track about the former.

28. The method as claimed in claim 1, wherein defining the coil track includes writing or patterning a path in the layer.

29. The method as claimed in claim 1, further comprising depositing, shaping and texturing the material comprising the layer to form the track by defining the path, in situ, on, or in, the surface of the former.

30. The method as claimed in claim 1, further including:

depositing, shaping and texturing the material comprising the layer; and forming the coil track.

31. A computer-readable medium storing computer-executable instructions for performing a method by a computer for determining an optimal path of a coil track in a layer of thin film material for use in a superconducting coil, the method comprising:

receiving a data set representing a physical property of the material comprising the layer;

processing the data set to form a map having features indicating variations in the physical property over the layer;

analyzing the features of the map to identify and locate defects in the layer;

for each of the defects, identifying whether the defect is irreparable; and calculating the optimal path of the coil track, wherein the path avoids any irreparable defects.

32. Apparatus for fabricating a track, the track being formed in a layer of thin film material for use in a superconducting coil, the layer provided on a former having a substantially curved surface, the track thereby being defined by a path being defined into or onto the layer, the apparatus comprising:

a scanner for scanning the layer to detect defects in the layer, the scanner comprising a probe for probing a physical characteristic of the material comprising the layer, the probe being arranged to transmit a signal comprising a data set of the physical property;

a memory for storing data;

a processor connected to the memory and the scanner, the processor being configured to:

control the probe and to receive the signal transmitted by the probe, process the signal, thereby extracting the data set, process the data set to form a map having features indicating variations in the physical property over the layer, analyze the features of the map to identify and locate each defect in the layer identify each defect that is irreparable, calculate an optimal coil path, wherein the path avoids any irreparable defects, and direct the data set and the map to the memory for storage; and a coil writer connected to the processor, the processor being configured to control the coil writer to define the optimal coil path into or onto the layer, thereby defining the coil track.

33. The apparatus as claimed in claim 32, further comprising a repairer, the repairer being connected to the processor, the processor being configured to identify those defects that are repairable and to control the repairer to repair the reparable defects.

34. The apparatus as claimed in claim 32, wherein the processor is further configured to:

calculate the optimal path in order to abandon each part of the layer having too many defects to be repairable or avoidable, or each part that would be more easily abandoned than repaired or avoided; and control the coil writer to interconnect those parts of the layer not abandoned.

35. The apparatus as claimed claim 32, wherein the processor is further configured to adapt the calculation of the optimal path such that the coil track produces a magnetic field that is predetermined.

36. The apparatus as claimed in claim 32, the layer being a thin film of superconducting material, the scanner comprising a coil tester, the processor connected to the coil tester and being configured to control the coil tester, wherein the processor controls the coil tester to locate weakly superconducting areas of the coil track by using a probe test or an electrical test or a combination of both, and wherein the processor calculates the optimal path in order to abandon a part of the coil that has poor superconducting properties.

37. The apparatus as claimed in claim 32, wherein the scanner comprises a plurality of probes, each probe configured to detect a different physical property of the material and create a different data set, and the scanner transmits the data set to the processor, and wherein the processor is further configured to process each data set to form a map of the variations of the corresponding material properties of the layer and to combine one or more of the maps of different physical properties to provide a composite map.

38. The apparatus as claimed in claim 32, wherein the layer is a buffer layer or a metallization layer.

39. The apparatus as claimed in claim 32, further including a deposition device being arranged to deposit, shape and texture the layer, in situ, on the surface of the former, wherein the apparatus is further arranged to form the track.

40. A method of fabricating a track in a layer of thin film material for use in a superconducting coil, the layer provided on a former having a substantially curved surface, the method comprising:

- scanning the layer to detect defects in the layer by probing a physical property of the material comprising the layer, before a coil path is defined in the layer, to provide a data set of the physical property;
- processing the data set to form a map, the map having features indicating variations in the physical property over the layer;
- analyzing the features of the map to identify and locate defects in the layer;
- for each of the defects, identifying whether the defect is irreparable;
- calculating a plurality of coil paths so as to avoid the irreparable defect(s);
- choosing one of the coil paths as an optimal path; and
- forming the optimal path in the layer to define the coil track.

41. A method of fabricating a track in a layer of thin film material for use in a superconducting coil, the layer provided on a former having a substantially curved surface, the method comprising:

- scanning the layer to detect variations of a physical property in the layer by probing the physical property of the material comprising the layer, before a coil path is defined in the layer, to provide a data set of the physical property;
- processing the data set to identify and locate variations of the physical property in the layer;
- choosing an optimal path based on the variations in the physical property; and
- defining the optimal path in the layer to define the coil track.

42. The method as claimed in claim 41, wherein a defect in the layer is indicated by the variations in the physical property in the layer, and wherein the method further comprises:

- identifying whether each defect is a repairable defect; and
- repairing each repairable defect.

43. The method as claimed in claim 41, wherein choosing the optimal path includes calculating the optimal path.

44. The method as claimed in claim 41, wherein a defect in the layer is indicated by the variations in the physical property in the layer, and choosing the optimal path includes avoiding any defect.

45. The method as claimed in claim 41, wherein the processing comprises:

- forming a map having features indicating the variations in the physical properties over the layer; and
- analyzing the features of the map to identify and locate defects in the layer, wherein a defect in the layer is indicated by variations in the physical property in the layer.

46. An apparatus for fabricating a track, the track being formed in a layer of thin film material for use in a superconducting coil, the layer provided on a former having a substantially curved surface, the track thereby being defined by a path being defined into or onto the layer, the apparatus comprising:

- a scanner configured to scan the layer to detect variations of a physical property in the layer, the scanner comprising a probe configured to probe the physical property of the material comprising the layer, the probe being configured to transmit a signal comprising a data set of the physical property;
- a memory configured to store data;
- a processor connected to the memory and the scanner, the processor being configured to:
  - control the probe and receive the signal transmitted by the probe,
  - process the signal, thereby extracting the data set,
  - process the data set to identify and locate the variations of the physical property in the layer,
  - choose an optimal coil path based on the detected variations in the physical property, and
  - direct the data set to the memory for storage; and
- a coil writer connected to the processor, the processor being configured to control the coil writer to define the optimal coil path into or onto the layer, thereby defining the coil track.

47. The apparatus as claimed in claim 46, wherein a defect in the layer is indicated by variations in the physical property in the layer, and in processing the data set the processor is further configured to:

- form a map having features indicating variations in the physical property over the layer; and
- analyze the features of the map to identify and locate each defect in the layer.

48. The apparatus as claimed in claim 46, wherein in choosing the optimal coil path the processor is configured to calculate the optimal coil path.

49. The apparatus as claimed in claim 46, wherein a defect in the layer is indicated by the variations in the physical property in the layer, and in choosing the optimal coil path the processor is configured to avoid any defect.

* * * * *

UNITED STATES PATENT AND TRADEMARK OFFICE

CERTIFICATE OF CORRECTION

PATENT NO. : 7,768,251 B2
APPLICATION NO. : 10/548086
DATED : August 3, 2010
INVENTOR(S) : Eamonn Maher It is certified that error appears in the above-identified patent and that said Letters Patent is hereby corrected as shown below:

Column 25, Claim 16, Line 26:

Please delete “locate the or each” and insert --locate each--.

Signed and Sealed this
Twenty-second Day of March, 2011

David J. Kappos

*Director of the United States Patent and Trademark Office*